(12) United States Patent
Watanabe

(10) Patent No.: US 9,064,968 B2
(45) Date of Patent: Jun. 23, 2015

(54) NON-VOLATILE MEMORY DEVICE AND OPERATION AND FABRICATING METHODS THEREOF

(71) Applicant: PHISON ELECTRONICS CORP., Miaoli (TW)

(72) Inventor: Hiroshi Watanabe, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 46 days.

(21) Appl. No.: 13/969,626

(22) Filed: Aug. 19, 2013

(65) Prior Publication Data
US 2015/0049557 A1 Feb. 19, 2015

(51) Int. Cl.
| | |
|---|---|
| G11C 16/16 | (2006.01) |
| H01L 29/788 | (2006.01) |
| G11C 16/04 | (2006.01) |
| G11C 16/14 | (2006.01) |
| G11C 16/26 | (2006.01) |
| H01L 21/768 | (2006.01) |
| G11C 16/10 | (2006.01) |

(52) U.S. Cl.
CPC .......... *H01L 29/788* (2013.01); *G11C 16/0408* (2013.01); *G11C 16/14* (2013.01); *G11C 16/26* (2013.01); *H01L 21/768* (2013.01); *G11C 16/16* (2013.01); *G11C 16/10* (2013.01)

(58) Field of Classification Search
CPC ...... G11C 16/16; G11C 16/10; G11C 16/102; G11C 16/26
USPC ........................... 365/185.33, 185.17, 185.01
See application file for complete search history.

(56) References Cited

U.S. PATENT DOCUMENTS

2008/0205160 A1\* 8/2008 Kim et al. ................ 365/185.22

\* cited by examiner

*Primary Examiner* — Jason Lappas
(74) *Attorney, Agent, or Firm* — Jianq Chyun IP Office

(57) ABSTRACT

Provided is a non-volatile memory device having a zigzag body wiring. First word lines and second word lines are disposed on a substrate, arranged periodically and extended along a first direction. First inter-poly dielectric films are disposed on the substrate and respectively beneath the first word lines. Second inter-poly dielectric films are disposed on the substrate and respectively beneath the second word lines, wherein the first inter-poly dielectric films are thinner than the second inter-poly dielectric films. A floating gate is disposed between the substrate and each of the first and second inter-poly dielectric films. A tunnel oxide film is disposed between the substrate and each of the floating gates. Bit lines are disposed above the first and second word lines and extended along a second direction different from the first direction.

13 Claims, 26 Drawing Sheets

NON-VOLATILE MEMORY DEVICE AND OPERATION AND FABRICATING METHODS THEREOF

BACKGROUND

1. Field of the Invention

The present invention relates to a non-volatile memory device, and an operation method and a fabrication method thereof, and more particularly to a NAND flash memory having a zigzag body wiring, and an operation method and a fabrication method thereof.

2. Description of Related Art

In recent years, in order to overcome the issues of NAND flash scaling, emerging memories and three-dimensional memories have been aggressively investigated. With no happening, the delay of word lines and/or bit lines limits the development of a memory controller.

At the upper and lower lines in FIG. 1, there are the cross-sections of bit lines. The distance between neighboring bit lines is wider at the upper lines than at the lower lines. The number of bit lines per unit space is larger at the lower, but the parasitic capacitance which causes the bit line delay exists. The self-align shallow trench isolation SA-STI, which is an important invention for the device scaling of NAND flash, greatly enhances the parasitic capacitance between neighboring bit lines. Therefore, the bit line delay has become notable with the scaling. At the upper and lower lines in FIG. 2, there are the cross-sections of word lines. The distance between neighboring word lines is wider at the upper lines than at the lower lines. The number of word lines per unit space is larger at the lower, but the parasitic capacitance which causes the word line delay exists.

To lower the bit cost, the cell-to-cell space is shrunk as the memory cell is miniaturized. Accordingly, the parasitic capacitance between neighboring word lines is increased with the device scaling of NAND cells. Therefore, the word line delay has become notable with the scaling.

SUMMARY OF THE DISCLOSURE

The present invention provides a non-volatile memory device, which includes: a well, disposed in a substrate; a plurality of first word lines and a plurality of second word lines, disposed on the substrate, arranged periodically and extending in a first direction; a plurality of inter-poly dielectric films, disposed on the substrate and respectively beneath the plurality of first word lines and the plurality of second word lines; a plurality of floating gates, disposed between the well and the plurality of inter-poly dielectric films; and a plurality of tunnel oxide films, disposed between the well and the plurality of floating gates, wherein a first distance from the first word lines to the substrate is smaller than a second distance from the second word lines to the substrate.

According to an exemplary embodiment of the present invention, a third distance from a top of the first word lines to the substrate is smaller than or equal to a fourth distance from a bottom of the second word lines to the substrate.

According to an exemplary embodiment of the present invention, the plurality of inter-poly dielectric films include a plurality of first inter-poly dielectric films disposed on the substrate and respectively beneath the first word lines, and a plurality of second inter-poly dielectric films disposed on the substrate and respectively beneath the second word lines, wherein a thickness of the plurality of first inter-poly dielectric films is smaller than a thickness of the plurality of second inter-poly dielectric films.

According to an exemplary embodiment of the present invention, the plurality of floating gates include a plurality of first floating gates disposed on the substrate and respectively beneath the plurality of first word lines, and a plurality of second floating gates disposed on the substrate and respectively beneath the plurality of second word lines, wherein a thickness of the plurality of first floating gates is smaller than a thickness of the plurality of second floating gates.

According to an exemplary embodiment of the present invention, the non-volatile memory device further includes a plurality of bit lines disposed above the first word lines and the second word lines and extending along a second direction different from the first direction.

According to an exemplary embodiment of the present invention, the plurality of bit lines include a plurality of first bit lines and a plurality of second bit lines, and a fifth distance from the first bit lines to the substrate is smaller than a sixth distance from the second bit lines to the substrate.

The present invention further provides a method for operating a non-volatile memory device having a substrate, a well, a plurality of first inter-poly dielectric films, a plurality of second inter-poly dielectric films, a plurality of first word lines and a plurality of second word lines disposed on the substrate and tunnel oxide films, wherein a first distance from the first word lines to the substrate being smaller than a second distance from the second word lines to the substrate. The method includes applying a first operating voltage to the first word lines, and applying a second operating voltage to the second word lines.

According to an exemplary embodiment of the present invention, wherein the first operating voltage includes a first program voltage, a first erase voltage, a first pass voltage or a first read voltage, and the second operating voltage includes a second program voltage, a second erase voltage, a second pass voltage or a second read voltage.

According to an exemplary embodiment of the present invention, the method further includes the following steps for programming the non-volatile memory device. The first program voltage is applied to a first word line, and the second program voltage is applied to a second word line. The first program voltage and the second program voltage satisfy the following equation:

$$C_{rA}V_{PGM-A}=C_{rB}V_{PGM-B},$$

wherein $V_{PGM-A}$ is the first program voltage applied to the first word line, $V_{PGM-B}$ is the second program voltage applied to the second word line, $C_{rA}$ is a first capacitance coupling ratio determined by a ratio of a capacitance of the first inter-poly dielectric films to a sum of capacitances of the first inter-poly dielectric films and the tunnel oxide films, and $C_{rB}$ is a second capacitance coupling ratio determined by a ratio of a capacitance of the second inter-poly dielectric films to a sum of capacitances of the second inter-poly dielectric films and the tunnel oxide films.

According to an exemplary embodiment of the present invention, the method further includes the following steps for erasing the non-volatile memory device. A well voltage is applied to the well, the first erase voltage is applied to the first word lines, and the second erase voltage is applied to the second word lines. The first erase voltage, the second erase voltage and the well voltage satisfy the following equation:

$$-C_{rA}(V_{well}-V_{CG-A})=-C_{rB}(V_{well}-V_{CG-B}),$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{well}$ is the well voltage, $V_{CG-A}$ is the first erase voltage applied to the first word lines, and $V_{CG-B}$ is the second erase voltage applied to the second word lines.

According to an exemplary embodiment of the present invention, the method further includes the following steps for reading the non-volatile memory device having a plurality of cells. Whether at least one cell to be read among the plurality of cells is connected with a first word line or a second word line is determined. If the at least one cell to be read among the plurality of cells is connected with a first word line, the first read voltage is applied to the first word line connected with the at least one cell to be read among the plurality of cells, the first pass voltage is applied to the other first word lines, and the second pass voltage is applied to the second word lines. If the at least one cell to be read among the plurality of cells is connected with a second word line, the second read voltage is applied to the second word line connected with the at least one cell to be read among the plurality of cells, the second pass voltage is applied to the other second word lines, and the first pass voltage is applied to the first word lines.

According to an exemplary embodiment of the present invention, the first pass voltage and the second pass voltage satisfy the following equation:

$$C_{rA}V_{pass-A}=C_{rB}V_{pass-B},$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{pass-A}$ is the first pass voltage, and $V_{pass-B}$ is the second pass voltage.

According to an exemplary embodiment of the present invention, the first read voltage and the second read voltage satisfy the following equation:

$$C_{rA}V_{read-A}=C_{rB}V_{read-B},$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{read-A}$ is the first read voltage, and $V_{read-B}$ is the second read voltage.

The present invention also provides a non-volatile memory device, which includes: a well, disposed in a substrate; a plurality of word lines, arranged in an array, disposed on the substrate and extending in a first direction; a plurality of inter-poly dielectric films respectively between the substrate and the plurality of word lines; a plurality of floating gates, respectively disposed between the well and the plurality of inter-poly dielectric films; a plurality of tunnel oxide films, respectively disposed between the well and the plurality of floating gates; and a plurality of first bit lines and a plurality of second bit lines, arranged periodically, disposed over the plurality of word lines, and extending in a second direction, wherein a first distance from the first bit lines to the substrate is smaller than a second distance from the second bit lines to the substrate.

According to an exemplary embodiment of the present invention, a third distance from a top of the first bit lines to the substrate is smaller than or equal to a fourth distance from a bottom of the second bit lines to the substrate.

According to an exemplary embodiment of the present invention, the first direction is perpendicular to the second direction.

The present invention further provides a fabrication method of a non-volatile memory device, which includes: forming a plurality of first word lines and a plurality of second word lines on a substrate, wherein the first word lines and the second word lines are arranged periodically and extend in a first direction; and forming a plurality of bit lines over the first and second word lines, wherein a first distance from the first word lines to the substrate is smaller than a second distance from the second word lines to the substrate.

According to an exemplary embodiment of the present invention, a third distance from a top of the first word lines to the substrate is smaller than or equal to a fourth distance from a bottom of the second word lines to the substrate.

According to an exemplary embodiment of the present invention, the step of forming a plurality of bit lines includes forming a plurality of first bit lines and a plurality of second bit lines, wherein the first bit lines and the second bit lines are arranged periodically and extend in a second direction different from the first direction, wherein a fifth distance from the first bit lines to the substrate is smaller than a sixth distance from the second bit lines to the substrate.

According to an exemplary embodiment of the present invention, a seventh distance from a top of the first bit lines to the substrate is smaller than or equal to an eighth distance from a bottom of the second bit lines to the substrate.

DESCRIPTION OF EMBODIMENTS

Figure 1:
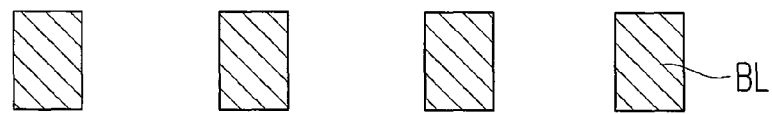
FIG. 1 illustrates an impact of device scaling on bit lines.
Figure 1:
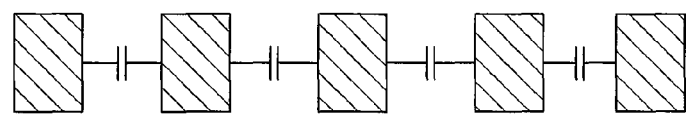

Reference now is made to the accompanying drawings to describe the specific exemplary embodiments and examples of the invention. Whenever possible, the same reference numbers are used in the drawings and the description to refer to the same or like parts.

Capacitance Coupling Ratio (Cr) is an important factor to design a memory cell and is defined as follows.

$$C_r := \frac{C_{IPD}}{C_{OX} + C_{IPD}}, \qquad \text{Eq. 1}$$

where $C_{OX}$ is the capacitance across the tunnel oxide and $C_{IPD}$ is the capacitance across the inter-poly dielectric layer. To make sure the controllability of a control gate on channel, the capacitance across the inter-poly dielectric layer ($C_{IPD}$) must be larger than that across the tunnel oxide ($C_{OX}$). In other words, the capacitance coupling ration (Cr) is larger than 0.5.

The self-potential of the floating gate ($V_{FG}$) is determined by this $C_r$ as follows.

$$V_{FG} = C_r V_{CG} \qquad \text{Eq. 2}$$

From this equation, it is found that the word line delay (same with $V_{CG}$ delay) causes the voltage actually applied to the floating gate ($V_{FG}$) to be fluctuated.

Figure 2:
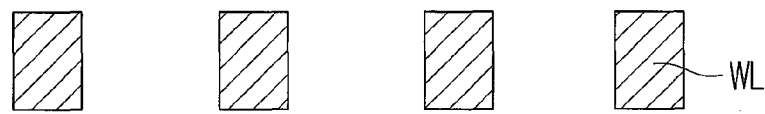
FIG. 2 illustrates an impact of device scaling on word lines.
Figure 2:
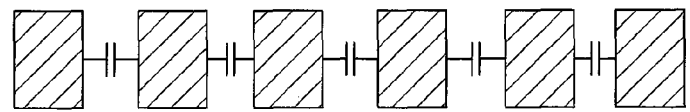

The reason of the word line delay is the parasitic resistance, which mainly comes from the capacitance between neighboring word lines. The distance between neighboring word lines is decreased with the device scaling of memory cells, as illustrated in FIG. 2. The array of word lines at the upper lines is sparser than that at the bottom lines. Note that, there is no bit line contact between word lines in the NAND flash array, which is convenient to integrate more bits per unit area. The capacitance between neighboring word lines at the upper lines is smaller than that at the bottom lines. More parasitic capacitance exists at the bottom lines, because the distance between neighboring word lines is shorter.

First Exemplary Embodiment

To suppress the parasitic capacitance, the distance between neighboring word lines may be increased. However, it appears that this is opposite to the device scaling of NAND flash with no bit line contact between cell transistors.

Zigzag Body Word Line

Figure 5:
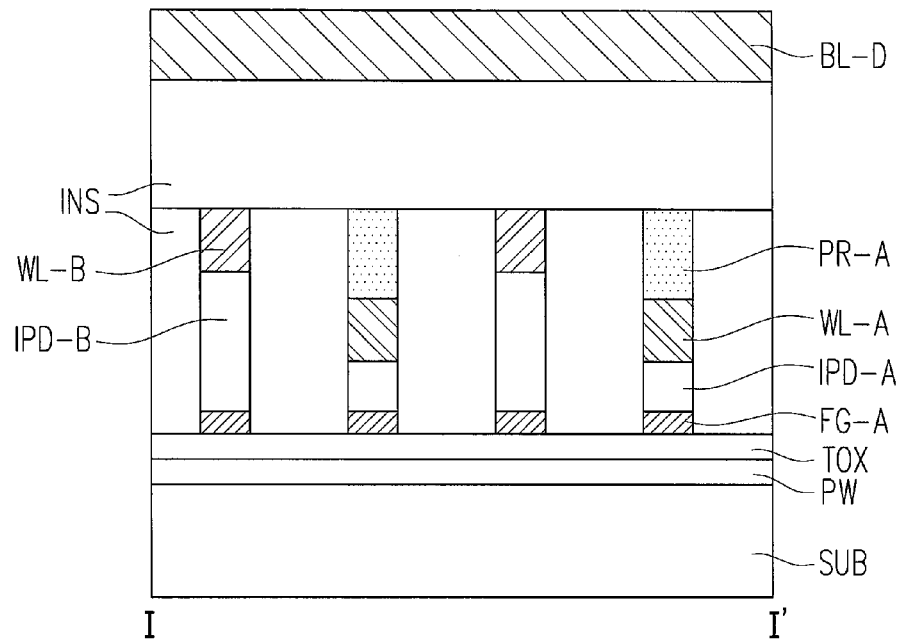
FIG. 5 and FIG. 5' each illustrate a cross-sectional view taken along the line I-I' in FIG. 3.
Figure 5:
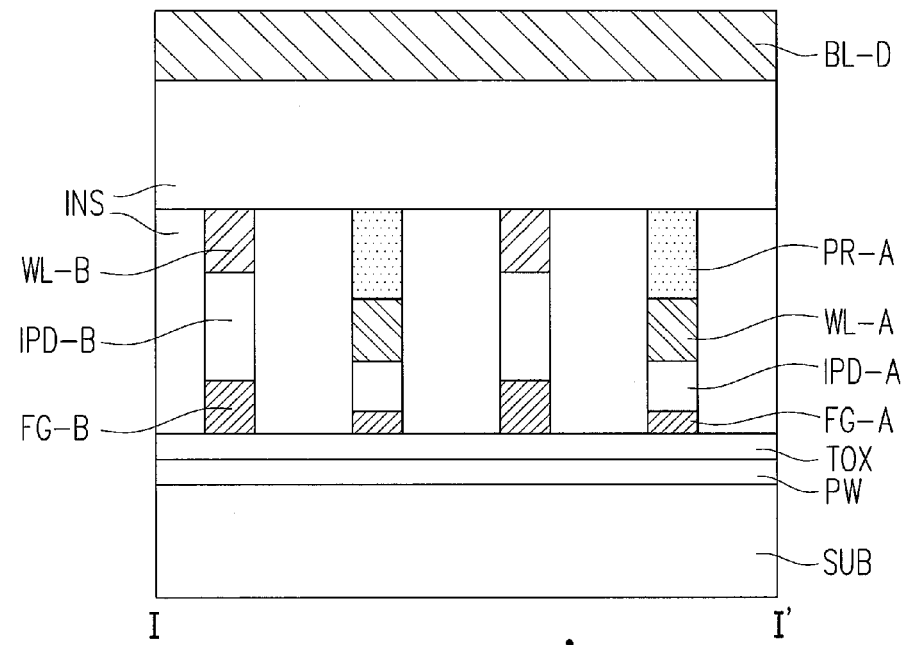
Figure 6:
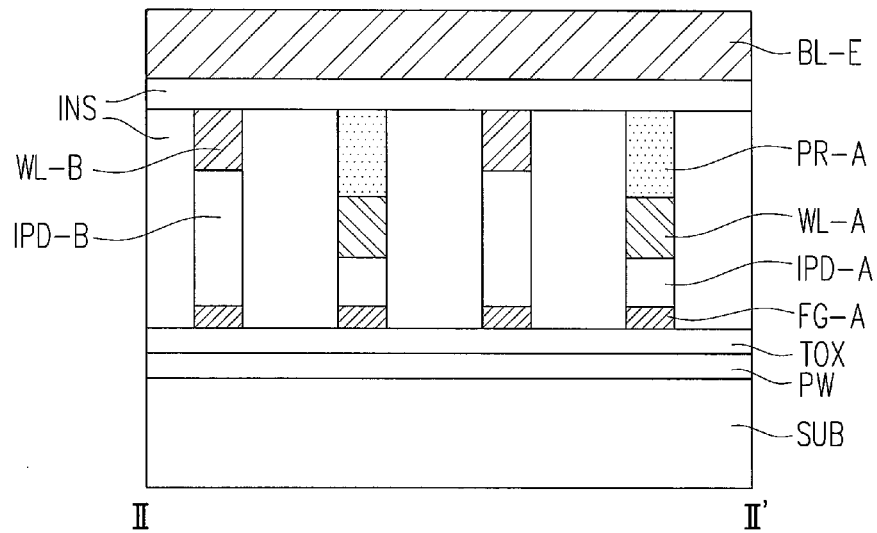
FIG. 6 and FIG. 6' each illustrate a cross-sectional view taken along the line II-II' in FIG. 3.
Figure 6:
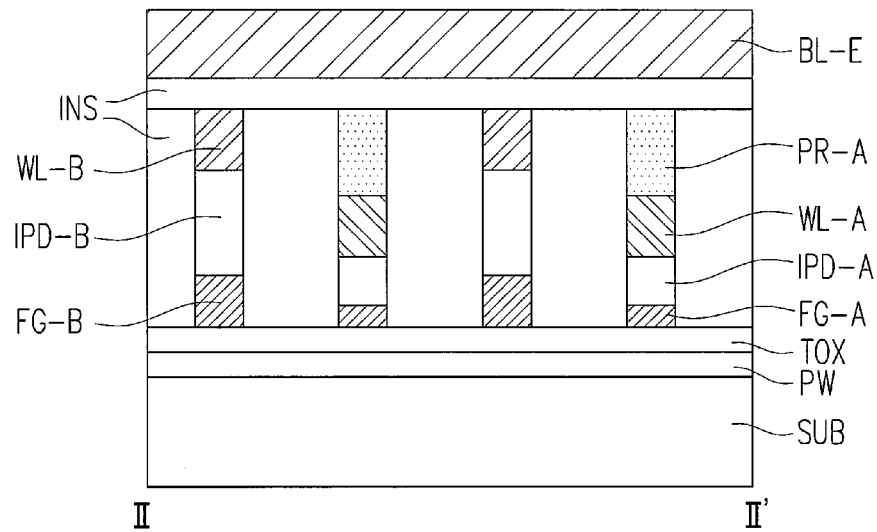

The first key idea of this exemplary embodiment of the invention is to make the scaling of NAND cells consistent with the smallest cell area, by adopting the zigzag body word line wiring, as illustrated in FIG. 5 and FIG. 6.

Figure 3:
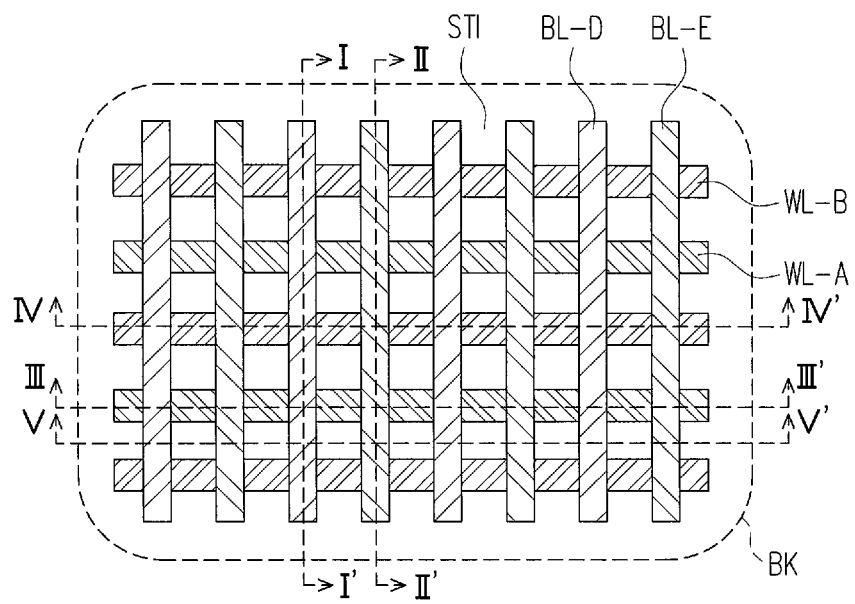
FIG. 3 illustrates a layout of a non-volatile memory device according to the first exemplary embodiment of the present invention.
Figure 4:
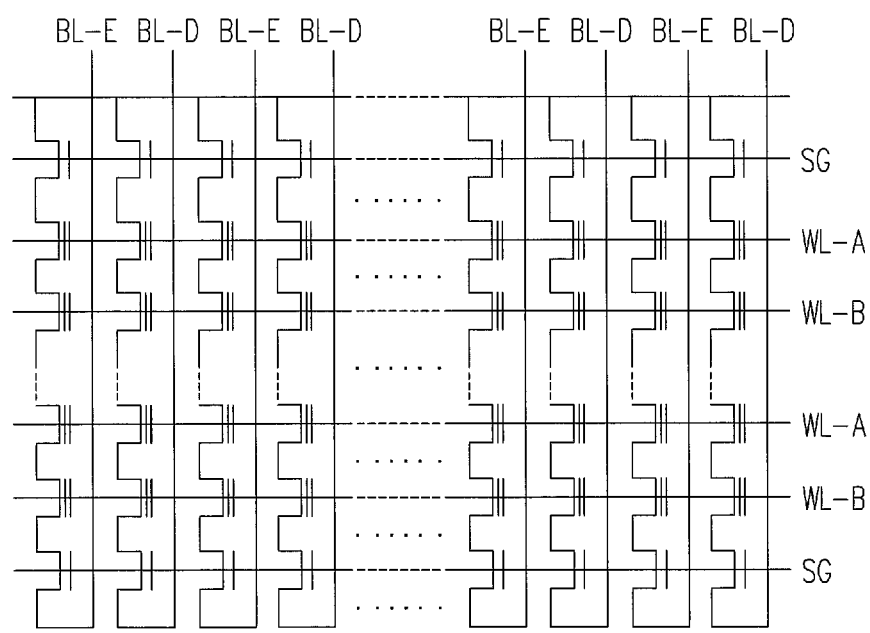
FIG. 4 is the equivalent circuit of the layout shown in FIG. 3.

FIG. 3 illustrates a layout of a non-volatile memory device according to the first exemplary embodiment of the present invention. Word lines WL-A and word lines WL-B are periodically arranged and extend in a first direction (e.g. the direction of row), while the bit lines BL-D and bit lines BL-E are periodically arranged and extend in a second direction (e.g. the direction of column). The second direction is different from the first direction. In this exemplary embodiment, the second direction is perpendicular to the first direction. FIG. 4 is the equivalent circuit of the layout shown in FIG. 3.

FIG. 5 illustrates a cross-sectional view taken along the line I-I' in FIG. 3. In NAND cells, word lines WL-A (at a lower plane) and word lines WL-B (at a higher plane) arranged alternately are disposed below the bit lines BL-D. In this exemplary embodiment of the invention, neighboring word lines exist separately and are located respectively at higher and lower planes. Such disposition reduces the capacitance between neighboring word lines. The process of forming the structure of FIG. 5 will be described with reference to FIGS. 28-38 in the Sixth Exemplary embodiment.

FIG. 6 illustrates a cross-sectional taken along the line II-II' in FIG. 3. In NAND cells, word lines WL-A (at a lower plane) and word lines WL-B (at a higher plane) arranged alternately are disposed below the bit lines BL-E. In this exemplary embodiment of the invention, neighboring word lines exist separately and are located respectively at higher and lower planes. Such disposition reduces the capacitance between neighboring word lines. In addition, neighboring bit lines exist separately and are located respectively at higher and lower planes.

However, it is noted that IPD thickness is periodically fluctuated between these two layers of WL-A and WL-B in both of FIG. 5 and FIG. 6. The inter-poly dielectric films IPD-B below word lines WL-B are thicker than the inter-poly dielectric films IPD-A below word lines WL-A. For the ease of recognition, the diffusion layers are omitted in figures, because they are not directly related to this invention.

In view of the above, the non-volatile memory device includes: a well PW disposed in a substrate SUB; a plurality of first word lines WL-A and a plurality of second word lines WL-B disposed on the substrate SUB, arranged periodically and extending in a first direction; a plurality of inter-poly dielectric films IPD disposed on the plurality of floating gates FG and respectively beneath the plurality of first word lines WL-A and the plurality of second word lines WL-B; a plurality of floating gates FG disposed between the well PW and the plurality of inter-poly dielectric films IPD; and a plurality of tunnel oxide films TOX disposed between the well PW and the plurality of floating gates FG. Besides, the distance from the first word lines WL-A to the substrate SUB is smaller than the distance from the second word lines WL-B to the substrate SUB. In this embodiment, the distance from the top of the first word lines WL-A to the substrate SUB is smaller than the distance from the bottom of the second word lines WL-B to the substrate SUB, but the invention is not limited thereto. In another embodiment, the distance from the top of the first word lines WL-A to the substrate SUB can be equal to the distance from the bottom of the second word lines WL-B to the substrate SUB. This corresponds to the case that the line K-K' and the line J-J' are coincide in FIG. 24 and FIG. 25.

Figure 7:
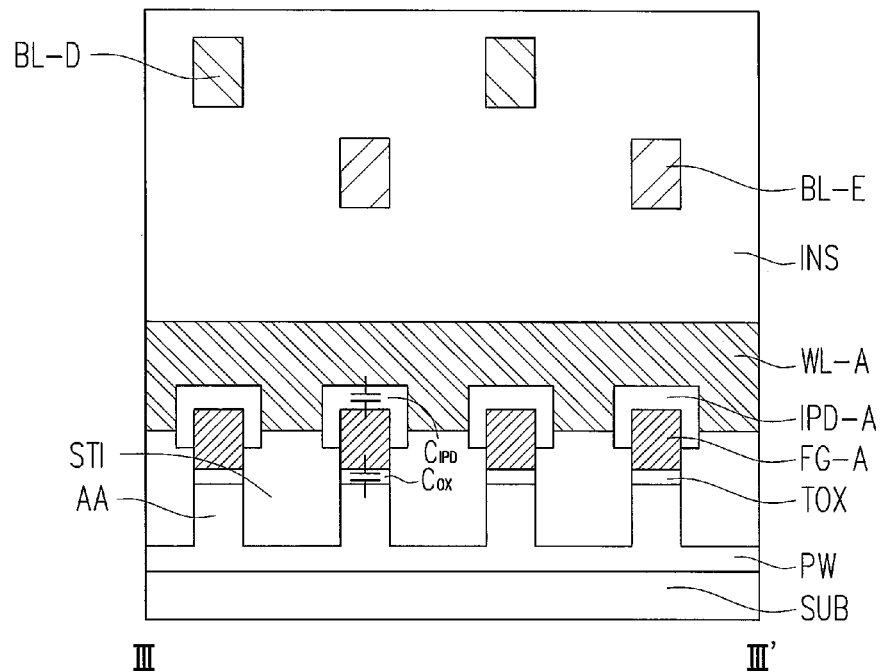
FIG. 7 illustrates a cross-sectional view taken along the line III-III' in FIG. 3.
Figure 8:
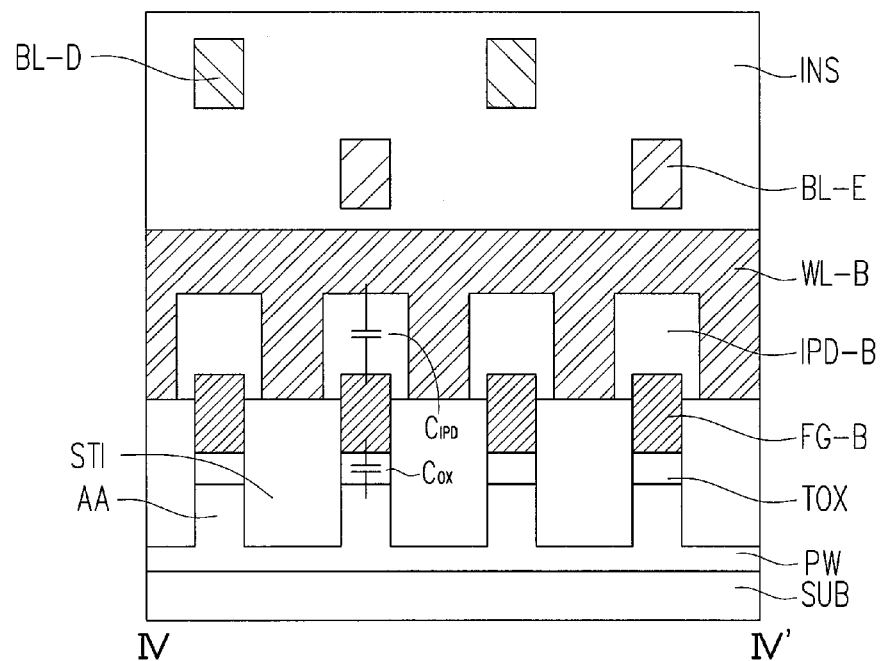
FIG. 8 and FIG. 8' each illustrate a cross-sectional view taken along the line IV-IV' in FIG. 3.
Figure 8:
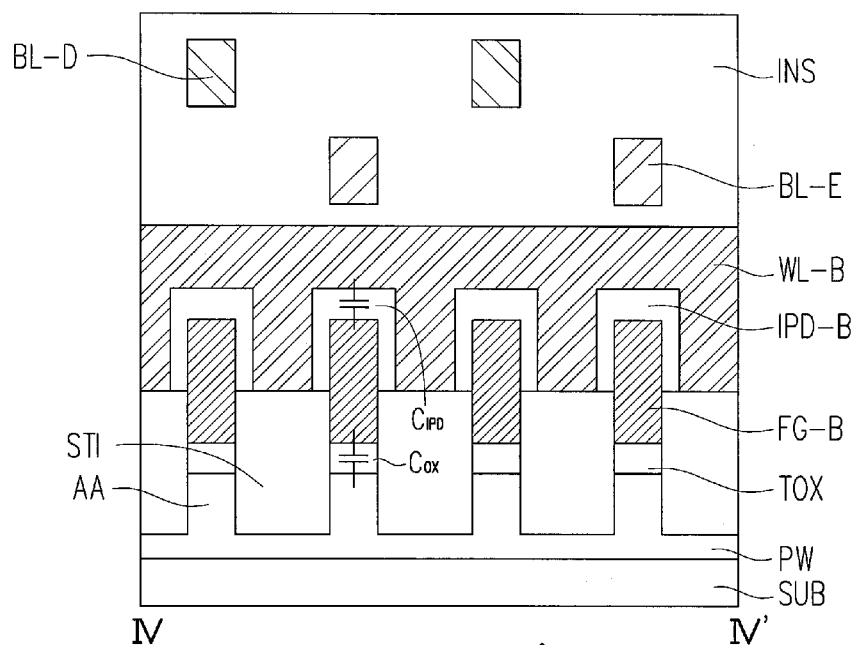

In addition, the plurality of inter-poly dielectric films IPD include a plurality of first inter-poly dielectric films IPD-A disposed on the plurality of floating gates FG and respectively beneath the first word lines WL-A; and a plurality of second inter-poly dielectric films IPD-B disposed on the substrate SUB and respectively beneath the second word lines WL-B. Besides, the thickness of the plurality of first inter-poly dielectric films IPD-A is smaller than the thickness of the plurality of second inter-poly dielectric films IPD-B. Cross-sectional views taken along the III-III' lines and IV-IV' in FIG. 3 are illustrated in FIG. 7 and FIG. 8 respectively.

Moreover, the plurality of floating gates FG include a plurality of first floating gates FG-A disposed on the tunnel oxide films TOX and respectively beneath the plurality of first word lines WL-A; and a plurality of second floating gates FG-B disposed on the tunnel oxide films TOX and respectively beneath the plurality of second word lines WL-B. Besides, the thickness of the plurality of first floating gates FG-A is smaller than the thickness of the plurality of second floating gates FG-B, as illustrated in FIG. 5', FIG. 6', FIG. 7 and FIG. 8'. In this event, IPD-A is thinner than IPD-B.

The non-volatile memory device further includes a plurality of bit lines BL disposed above the first word lines WL-A and the second word lines WL-B and extending along a second direction different from the first direction. The plurality of bit lines BL include a plurality of first bit lines BL-E and a plurality of second bit lines BL-D, and the distance from the first bit lines BL-E to the substrate SUB is smaller than the distance from the second bit lines BL-D to the substrate SUB.

The second key idea of this exemplary embodiment of the invention is the method for solving this issue. It will be described below.

Accordingly, the capacitance coupling ratios ($C_{rA}$ and $C_{rB}$) below WL-A and WL-B are respectively determined as follows.

$$C_{rA} := \frac{C_{IPD-A}}{C_{OX} + C_{IPD-A}} \qquad \text{Eq. 3}$$

$$C_{rB} := \frac{C_{IPD-B}}{C_{OX} + C_{IPD-B}} \qquad \text{Eq. 4}$$

Since the inter-poly dielectric films IPD-B are thicker than the inter-poly dielectric films IPD-A, the capacitance coupling ratio below WL-A is larger than that below WL-B.

$$C_{rB} := \frac{C_{IPD-B}}{C_{OX} + C_{IPD-B}} < C_{rA} \qquad \text{Eq. 5}$$

The voltage applied to the floating gate (or called self-potential of FG) is determined by the control gate voltage using Eq. 2.

In this exemplary embodiment of the invention, the self-potential of FG below WL-A ($V_{FG-A}$) and the self-potential of FG below WL-B ($V_{FG-B}$) are respectively determined by control gate voltages ($V_{CG-A}$ and $V_{CG-B}$).

$$V_{FG-A} = C_{rA} V_{CG-A} \qquad \text{Eq. 6}$$

$$V_{FG-B} = C_{rB} V_{CG-B} \qquad \text{Eq. 7}$$

It should be noted that it is preferred to control the self-potentials ($V_{FG-A}$ and $V_{FB-B}$) in a uniform manner regardless of WL-A and WL-B, while there is a periodical difference between WL-A and WL-B. The condition for this is written in the following equation.

$$C_{rA} V_{CG-A} = C_{rB} V_{CG-B} \qquad \text{Eq. 8}$$

This means that the control gate voltages applied by WL-A and WL-B ($V_{CG-A}$ and $V_{CG-B}$) satisfy the following relationship.

$$V_{CG-B} = \frac{C_{rA}}{C_{rB}} V_{CG-A} < V_{CG-A} \qquad \text{Eq. 9}$$

The method for operating the said non-volatile memory device is described in the following. The operating method includes applying a first operating voltage to the first word lines WL-A; and applying a second operating voltage to the second word lines WL-B. The first operating voltage includes a first program voltage, a first erase voltage, a first pass voltage or a first read voltage. The second operating voltage includes a second program voltage, a second erase voltage, a second pass voltage or a second read voltage.

Programming Operation

The operating method further includes the following steps for programming the non-volatile memory device. To program, a first program voltage $V_{PGM-A}$ is applied to a first word line WL-A, and subsequently a second program voltage $V_{PGM-B}$ is applied to a second word line WL-B. In this event, the self-potentials below WL-A and WL-B are respectively determined as follows.

$$V_{FG-A} = C_{rA} V_{PGM-A} \qquad \text{Eq. 10A}$$

$$V_{FG-B} = C_{rB} V_{PGM-B} \qquad \text{Eq. 10B}$$

To control the self-potentials ($V_{FG-A}$ and $V_{FB-B}$) in a uniform manner regardless of WL-A and WL-B, the following equation must be satisfied. The first program voltage $V_{FG-A}$ and the second program voltage $V_{FB-B}$ satisfy the following equation:

$$C_{rA} V_{PGM-A} = C_{rB} V_{PGM-B} \qquad \text{Eq. 11}$$

wherein $V_{PGM-A}$ is the first program voltage applied to a first word line WL-A, $V_{PGM-B}$ is the second program voltage applied to a second word line WL-B, $C_{rA}$ is a first capacitance coupling ratio determined by a ratio of a capacitance of the inter-poly dielectric film IPD-A to a sum of capacitances of the inter-poly dielectric film IPD-A and the tunnel oxide film, and $C_{rB}$ is a second capacitance coupling ratio determined by a ratio of a capacitance of the inter-poly dielectric film IPD-B to a sum of capacitances of the inter-poly dielectric film IPD-B and the tunnel oxide film.

As a result, it is found that the program voltages in this exemplary embodiment of the invention are periodically changing with regard to WL-A and WL-B as follows.

$$V_{PGM-B} = \frac{C_{rA}}{C_{rB}} V_{PGM-A} < V_{PGM-A} \qquad \text{Eq. 12}$$

Erasing Operation

The operating method further includes the following steps for erasing the entire non-volatile memory cells at the same moment (flash). A voltage $V_{Pwell}$ is applied to the P-well PW. Secondly, the periodical difference with respect to WL-A and WL-B is taken into consideration. In this event, the self-potentials of FG below WL-A and WL-B ($V_{FG-A}$ and $V_{FG-B}$) are given with respect to WL-A and WL-B as follows.

$$V_{FG-A} = -C_{rA}(V_{Pwell} - V_{CG-A}) \quad \text{Eq. 13}$$

$$V_{FG-B} = -C_{rB}(V_{Pwell} - V_{CG-B}) \quad \text{Eq. 14}$$

Since the voltage $V_{Pwell}$ cannot be selectively applied to memory cells under WL-A and WL-B, it is necessary to selectively apply $V_{CG-A}$ and $V_{CG-B}$ at the same moment. The first erase voltage $V_{CG-A}$ is applied to the first word lines WL-A, and the second erase voltage $V_{CG-B}$ is applied to the second word lines WL-B. To make the self-potentials in a unique manner regardless of WL-A and WL-B, the following condition must be satisfied. The first erase voltage $V_{CG-A}$, the second erase voltage $V_{CG-B}$ and the well voltage $V_{Pwell}$ satisfy the following equation:

$$-C_{rA}(V_{Pwell} - V_{CG-A}) = -C_{rB}(V_{Pwell} - V_{CG-B}) \quad \text{Eq. 15}$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{Pwell}$ is the well voltage, $V_{CG-A}$ is the first erase voltage applied to the first word lines, and $V_{CG-B}$ is the second erase voltage applied to the second word lines.

The relationship among $V_{Pwell}$, $V_{CG-A}$ and $V_{CG-B}$ can be derived and $V_{Pwell}$, $V_{CG-A}$ and $V_{CG-B}$ may satisfy the following equation during the erasing operation.

$$V_{CG-B} = \frac{C_{rA}}{C_{rB}} V_{CG-A} + \left(1 - \frac{C_{rA}}{C_{rB}}\right) V_{Pwell} \quad \text{Eq. 16}$$

In the event that the control gate voltage applied to WL-A ($V_{CG-A}$) is zero, the control gate voltage applied to WL-B ($V_{CG-B}$) and the voltage $V_{Pwell}$ have the following relationship.

$$V_{CG-A} \equiv 0: V_{CG-B} = \left(1 - \frac{C_{rA}}{C_{rB}}\right) V_{Pwell} < 0 \quad \text{Eq. 17}$$

In the event that the control gate voltage applied to WL-B ($V_{CG-B}$) is zero, the control gate voltage applied to WL-A ($V_{CG-A}$) and the voltage $V_{Pwell}$ have the following relationship.

$$V_{CG-B} \equiv 0: V_{CG-A} = \left(1 - \frac{C_{rB}}{C_{rA}}\right) V_{Pwell} > 0 \quad \text{Eq. 18}$$

Reading Operation

The operating method further includes the following steps for reading the non-volatile memory device having a plurality of cells. First, whether at least one cell to be read among the plurality of cells is connected with the first word lines WL-A or the second word lines WL-B is determined.

If at least one cell to be read among the plurality of cells is connected with a first word line WL-A, the first read voltage $V_{read-A}$ is applied to the first word line WL-A connected with the cell to be read among the plurality of cells, the first pass voltage $V_{pass-A}$ is applied to the other first word lines WL-A, and the second pass voltage $V_{pass-B}$ is applied to the second word lines WL-B. If at least one cell to be read among the plurality of cells is connected with a second word line WL-B, the second read voltage $V_{read-B}$ is applied to the second word line WL-B connected with the cell to be read among the plurality of cells, the second pass voltage $V_{pass-B}$ is applied to the other second word line WL-B, and the first pass voltage $V_{pass-A}$ is applied to the first word lines WL-A.

Specifically, to read a selected cell in a NAND string, pass voltage is applied to the word line connected to the other cells than the cell to be read. The self-potentials of floating gates not to be read while reading the selected cell are respectively written as follows, wherein $V_{pass-A}$ and $V_{pass-B}$ are the pass voltages applied to WL-A and WL-B, respectively.

$$V_{FG-A} = C_{rA} V_{pass-A} \quad \text{Eq. 19}$$

$$V_{FG-B} = C_{rB} V_{pass-B} \quad \text{Eq. 20}$$

To make the self-potentials of non-selected cells same, the following equation may be satisfied.

$$C_{rA} V_{pass-A} = C_{rB} V_{pass-B} \quad \text{Eq. 21}$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{pass-A}$ is the first pass voltage, and $V_{pass-B}$ is the second pass voltage.

In this event, the following condition may be satisfied.

$$V_{pass-B} = \frac{C_{rA}}{C_{rB}} V_{pass-A} \quad \text{Eq. 22}$$

Since $C_{rA}$ is larger than $C_{rB}$ in this example, $V_{pass-B}$ is larger than $V_{pass-A}$.

$$V_{pass-B} = \frac{C_{rA}}{C_{rB}} V_{pass-A} > V_{pass-A} \quad \text{Eq. 23}$$

To read the selected cell, the read voltage is applied to the selected cell. If the selected cell is connected to WL-A, the self-potential of the floating gate of the selected cell is determined by the following equation.

$$V_{FG-A} = C_{rA} V_{read-A} \quad \text{Eq. 24}$$

If the selected cell is connected to WL-B, the self-potential of the floating gate of the selected cell is determined by the following equation.

$$V_{FG-B} = C_{rB} V_{read-B} \quad \text{Eq. 25}$$

To make the self-potentials of the selected cells same regardless of WL-A and WL-B, the following equation may be satisfied.

$$C_{rA} V_{read-A} = C_{rB} V_{read-B} \quad \text{Eq. 26}$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{read-A}$ is the first read voltage, and $V_{read-B}$ is the second read voltage.

From this equation, it is preferable to change the read voltages with respect to WL-A and WL-B.

$$V_{read-B} = \frac{C_{rA}}{C_{rB}} V_{read-A} \qquad \text{Eq. 27}$$

In this example, since $C_{rA}$ is larger than $C_{rB}$, the following condition may be satisfied.

$$V_{read-B} = \frac{C_{rA}}{C_{rB}} V_{read-A} > V_{read-A} \qquad \text{Eq. 28}$$

Zigzag Bit Line Wiring

With the scaling of NAND flash, the distance between neighboring bit lines is shrunk, as illustrated in FIG. 1. To suppress the increase in the parasitic capacitance between them, a zigzag body bit line wiring shall be useful.

FIG. 7 illustrates a cross-sectional view taken along the line III-III' in FIG. 3. There is a periodical layer of bit lines in NAND cells, i.e., bit lines BL-E (at a lower plane) and bit lines BL-D (at a higher plane) above word lines WL-A. In this exemplary embodiment of the invention, neighboring bit lines exist separately and respectively at higher and lower planes. Such disposition reduces the capacitance between neighboring bit lines.

FIG. 8 and FIG. 8' each illustrate a cross-sectional view taken along the line IV-IV' in FIG. 3. In NAND cells, bit lines BL-D (at an upper plane) and bit lines BL-E (at a lower plane) arranged alternately are disposed above the word lines WL-B. In this exemplary embodiment of the invention, neighboring bit lines exist separately and are located respectively at higher and lower planes. Such disposition reduces the capacitance between neighboring bit lines.

Figure 9:
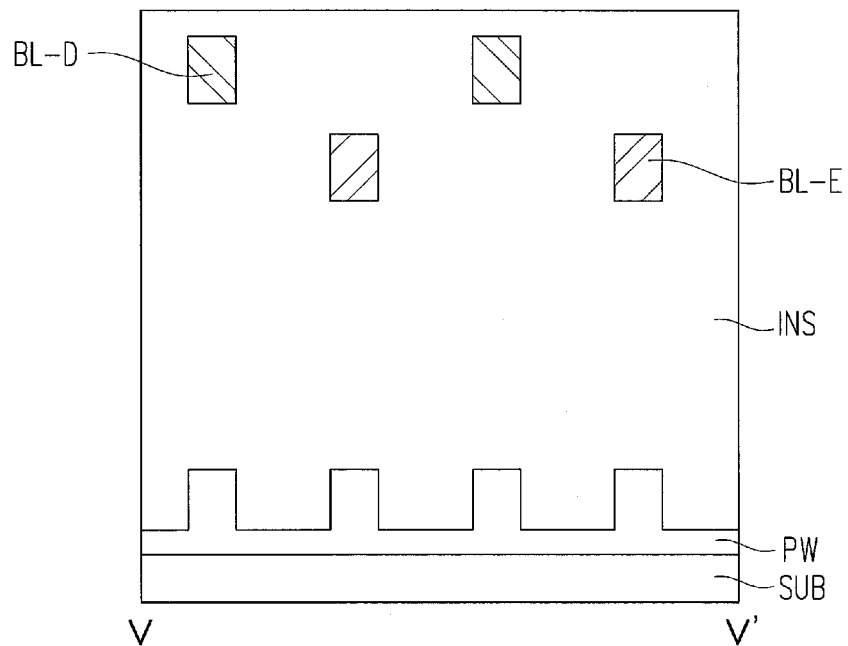
FIG. 9 illustrates a cross-sectional view taken along the line V-V' in FIG. 3.

FIG. 9 illustrates a cross-sectional view taken along the line V-V' in FIG. 3. In NAND cells, bit lines BL-D (at an upper plane) and bit lines BL-E (at a lower plane) arranged periodically. The bit lines BL-D and BL-E are located in the insulating film INS.

In view of the above, the non-volatile memory device includes: a well PW disposed in a substrate SUB; a plurality of word lines WL arranged in an array, disposed on the substrate SUB and extending in a first direction; a plurality of inter-poly dielectric films IPD respectively between the substrate SUB and the plurality of word lines WL; a plurality of floating gates FG respectively disposed between the well PW and the plurality inter-poly dielectric films IPD; a plurality of tunnel oxide films TOX respectively disposed between the well PW and the plurality of floating gates FG; and a plurality of first bit lines BL-E and a plurality of second bit lines BL-D arranged periodically, disposed over the plurality of word lines WL, and extending in a second direction, wherein the first direction is perpendicular to the second direction. Besides, the distance from the first bit lines BL-E to the substrate SUB is smaller than the distance from the second bit lines BL-D to the substrate SUB. In this embodiment, the distance from the top of the first bit lines BL-E to the substrate SUB is smaller than the distance from the bottom of the second bit lines BL-D to the substrate SUB, but the invention is not limited thereto. In another embodiment, the distance from the top of the first bit lines BL-E to the substrate SUB can be equal to the distance from the bottom of the second bit lines BL-D to the substrate SUB. This corresponds to the case that the line O-O' and the line N-N' are coincide in FIG. 26 and FIG. 27.

Second Exemplary Embodiment

Word lines WL-A and word lines WL-B are periodically arranged and extend in a first direction (e.g. the direction of row), while the bit lines BL-D and bit lines BL-E are periodically arranged and extend in a second direction (e.g. the direction of column). The second direction is different from the first direction. In this exemplary embodiment, the second direction is perpendicular to the first direction.

Figure 10:
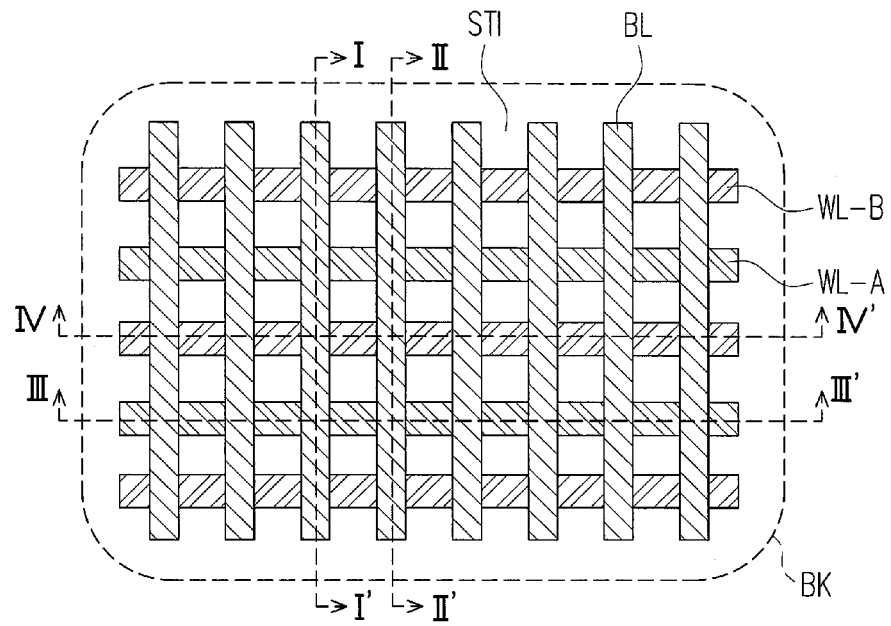
FIG. 10 illustrates a layout of a non-volatile memory device according to the second exemplary embodiment of the present invention.
Figure 11:
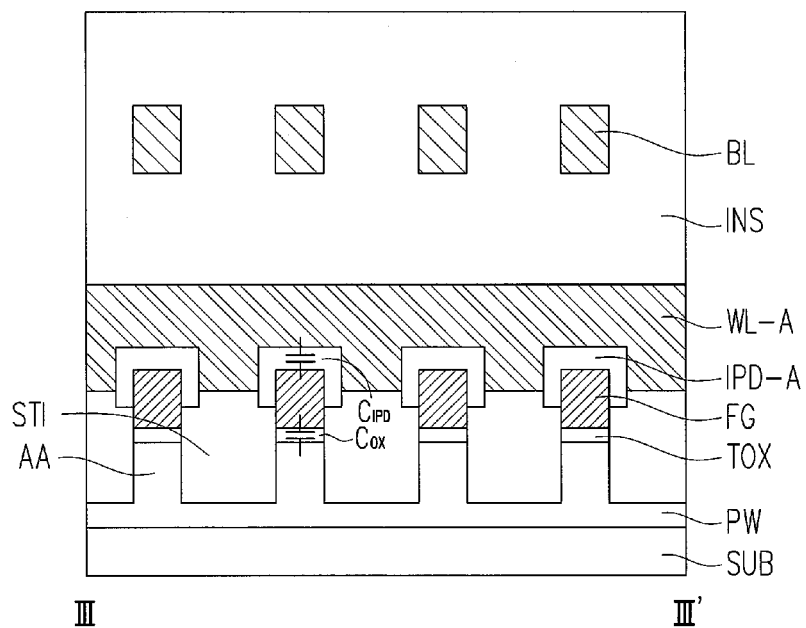
FIG. 11 illustrates a cross-sectional view taken along the line III-III' in FIG. 10.
Figure 12:
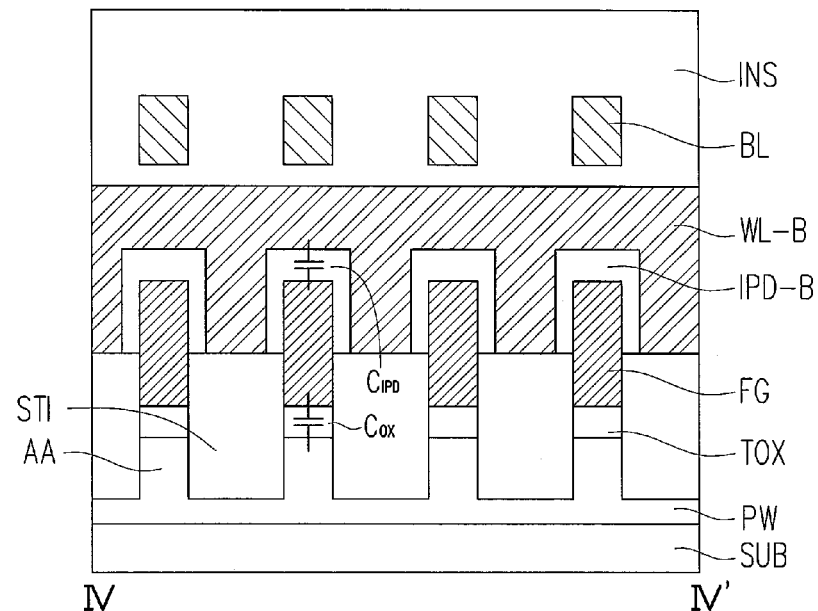
FIG. 12 and FIG. 12' each illustrate a cross-sectional view taken along the line IV-IV' in FIG. 10.
Figure 12:
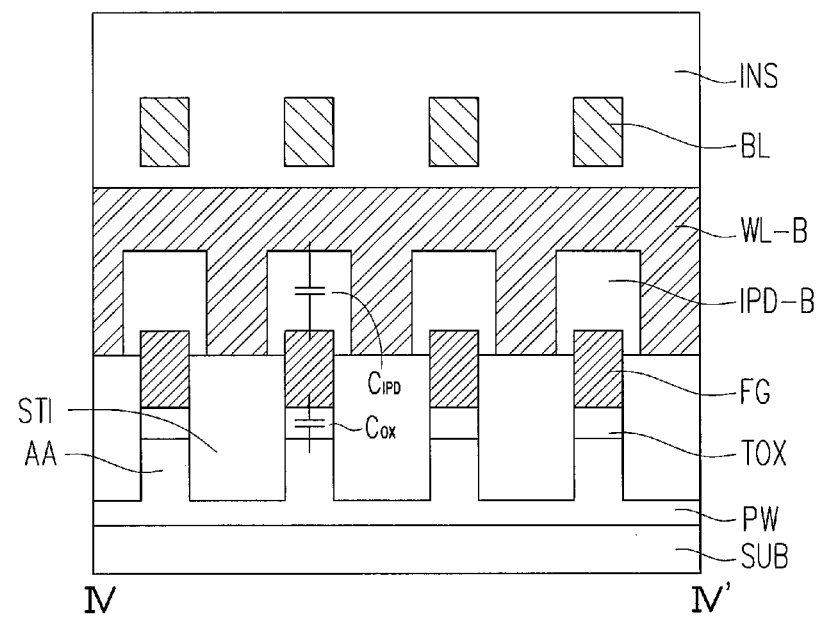

FIG. 10 illustrates a layout of a non-volatile memory device according to the second exemplary embodiment of the present invention. The word lines WL-A and WL-B are periodically arranged in the direction of row, while the bit lines BL are homogenously arranged in the direction of column. The cross-sectional views taken along the lines I-I' and II-II' in FIG. 10 are similar to the cross-sectional view shown in FIG. 5 or FIG. 5'. We may replace BL-D with BL in FIG. 5 and FIG. 5'. The cross-sectional views taken along the lines III-III' and IV-IV' in FIG. 10 are illustrated in FIG. 11 and FIG. 12, respectively.

Figure 13:
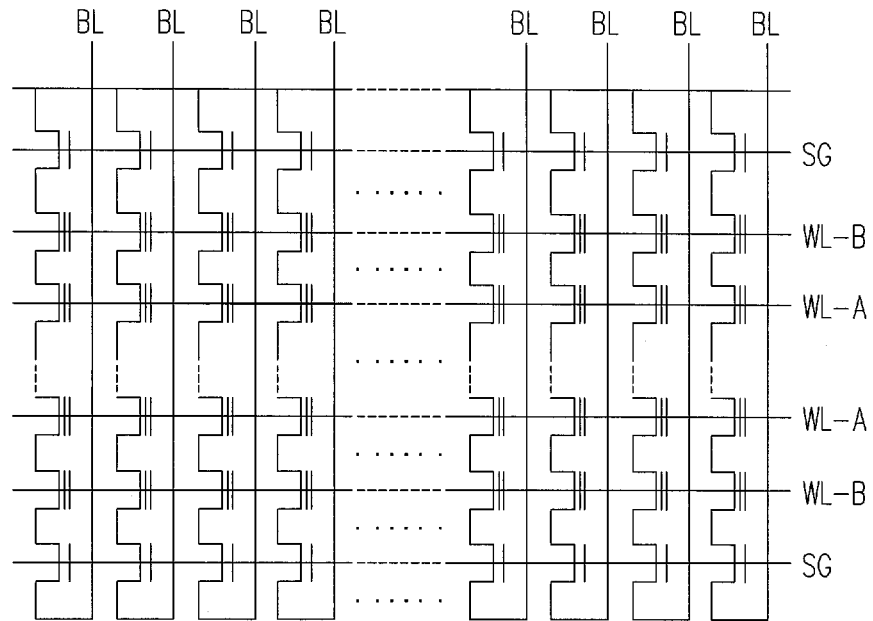
FIG. 13 is the equivalent circuit of the layout shown in FIG. 10.

FIG. 13 is the equivalent circuit of the layout shown in FIG. 10. The word lines WL-A and WL-B are periodically arranged in the direction of row, while the bit lines BL are arranged at the same plane in the direction of column.

Third Exemplary Embodiment

Figure 14:
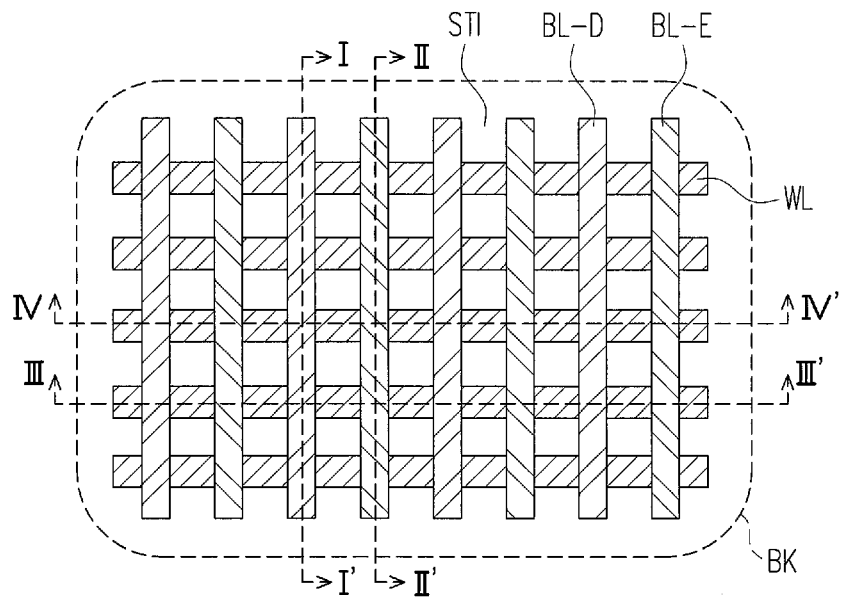
FIG. 14 illustrates a layout of a non-volatile memory device according to the third exemplary embodiment of the present invention.
Figure 15:
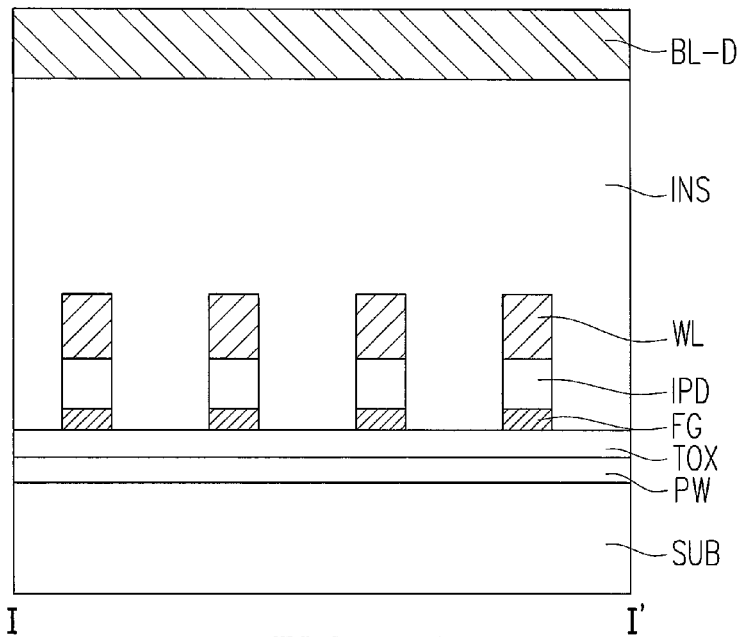
FIG. 15 illustrates a cross-sectional view taken along the line I-I' in FIG. 14.
Figure 16:
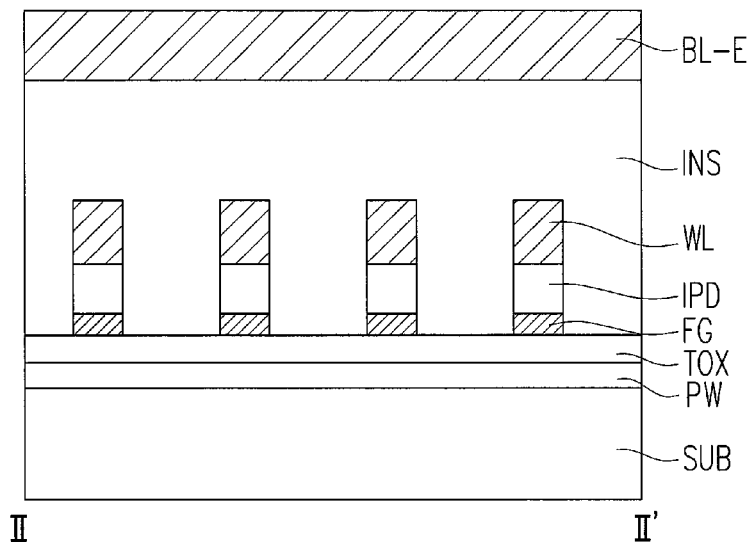
FIG. 16 illustrates a cross-sectional view taken along the line II-II' in FIG. 14.

FIG. 14 illustrates a layout of a non-volatile memory device according to the third exemplary embodiment of the present invention. The word lines WL are homogeneously arranged in the direction of row, while the bit lines BL-D and BL-E are periodically arranged in the direction of column. The cross-sectional views taken along the lines III-III' and IV-IV' in FIG. 14 are similar to the cross-sectional view shown in FIG. 7. We may replace WL-A with WL in FIG. 7. The cross-sectional views taken along the lines I-I' and II-II' are illustrated in FIG. 15 and FIG. 16, respectively.

Figure 17:
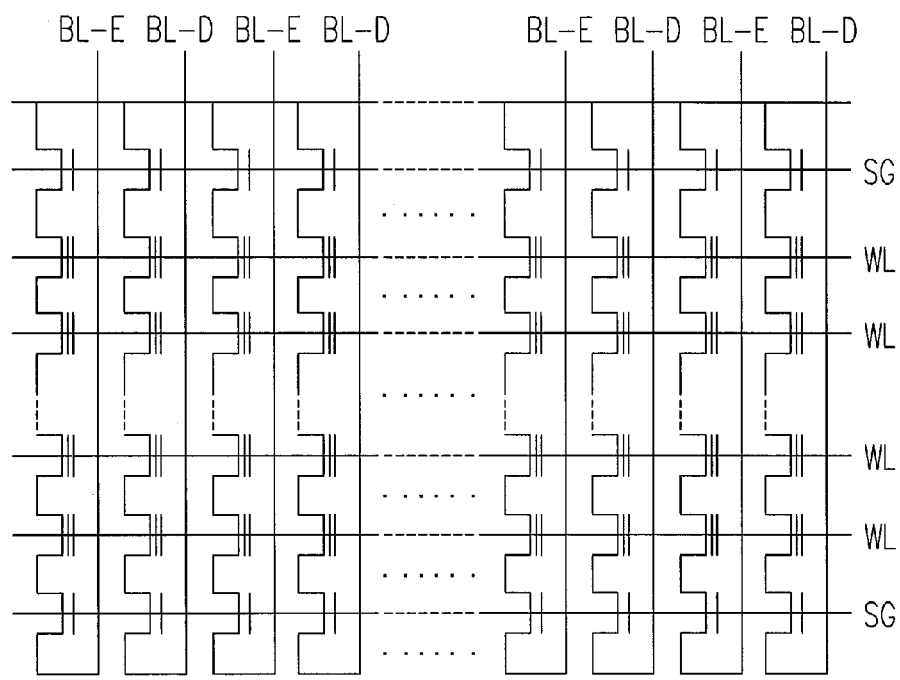
FIG. 17 is the equivalent circuit of the layout shown in FIG. 14.

FIG. 17 is the equivalent circuit of the layout shown in FIG. 14. The word lines WL are arranged at the same plane in the direction of row, while the bit lines BL-D and BL-E are periodically arranged in the direction of column.

Fourth Exemplary Embodiment

High-k IPD

Figure 18:
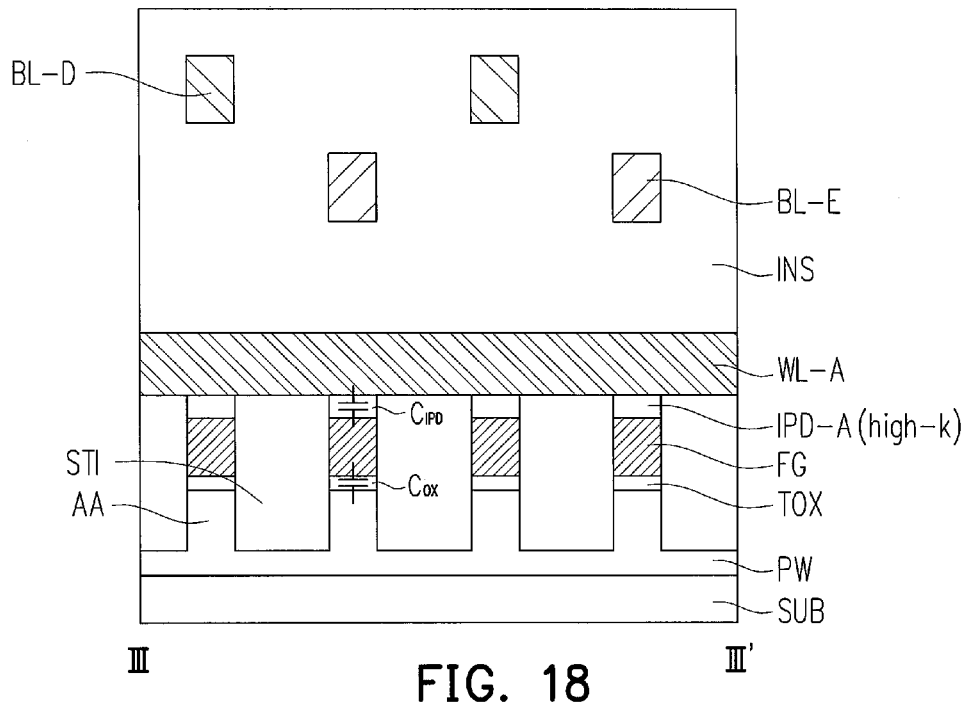
FIG. 18 illustrates a cross-sectional view of the fourth exemplary embodiment taken along the line III-III' in FIG. 3.

FIG. 18 illustrates a cross-sectional view of the fourth exemplary embodiment taken along the line III-III' in FIG. 3. There are high dielectric-constant (high-k) layers IPD-A between word lines WL-A and floating gates FG, while there are zigzag bit lines composed of bit lines BL-D and BL-E above the word lines WL-A. A high-k material includes a dielectric material with a dielectric constant greater than 3.9. In an exemplary embodiment, the high-k material is selected from the group consisting of metal oxide, metal nitride, metal silicide, transition metal oxide, transition metal nitride, transition metal salicide, metal oxynitride, metal aluminate, zirconium silicate, zirconium aluminate, and combinations thereof. For example, the high-k material can include silicon oxide, silicon nitride, silicon oxynitride, hafnium oxide (HfO$_2$), zirconium oxide, titanium oxide, aluminum oxide, HfO$_2$-alumina alloy, hafnium silicon oxide (HfSiO), hafnium silicon oxynitride (HfSiON), hafnium tantalum oxide (HfTaO), hafnium titanium oxide (HfTiO), hafnium zirconium oxide (HfZrO), Ta$_2$O$_5$, HfAlO$_x$, or a combination thereof.

Figure 19:
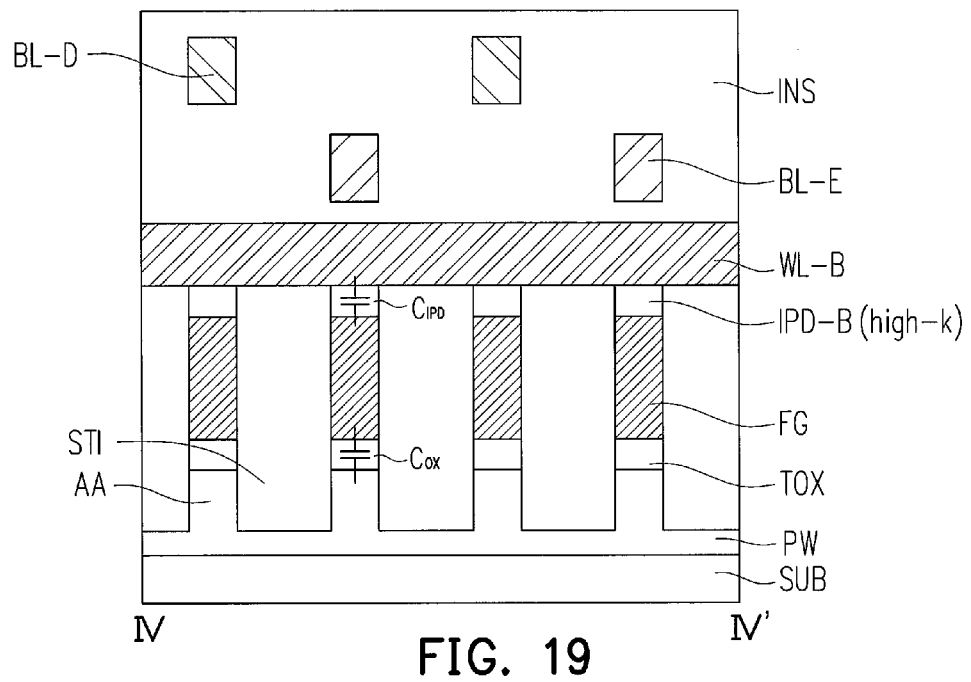
FIG. 19 illustrates a cross-sectional view of the fourth exemplary embodiment taken along the line IV-IV' in FIG. 3.

FIG. 19 illustrates a cross-sectional view of the fourth exemplary embodiment taken along the line IV-IV' in FIG. 3. There are high-k layers IPD-B between word lines WL-B and floating gates FG, while there are zigzag bit lines composed of bit lines BL-D and BL-E above the word lines WL-B.

Figure 20:
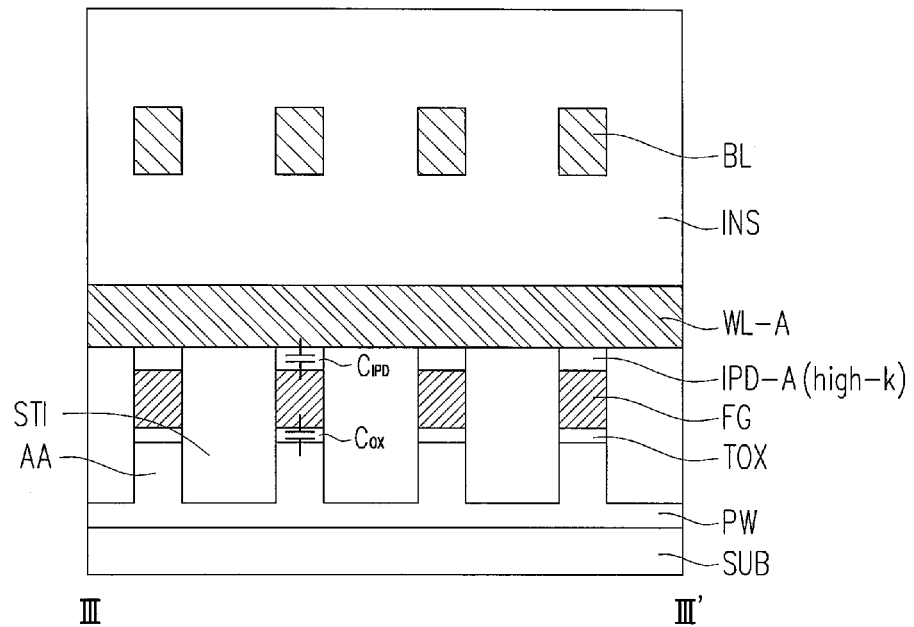
FIG. 20 illustrates a cross-sectional view of the fourth exemplary embodiment taken along the line III-III' in FIG. 3.
Figure 21:
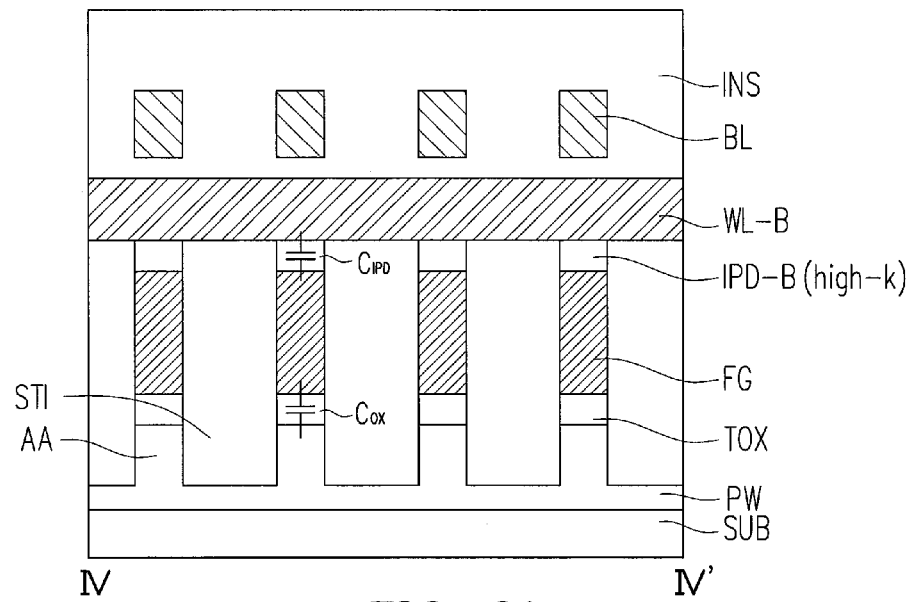
FIG. 21 illustrates a cross-sectional view of the fourth exemplary embodiment taken along the line IV-IV' in FIG. 3.

FIG. 20 illustrates a cross-sectional view of the fourth exemplary embodiment taken along the line III-III' in FIG. 10. There are high-k layers IPD-A between word lines WL-A and floating gates FG, while there are bit lines BL above the word lines WL-A. FIG. 21 illustrates a cross-sectional view of the fourth exemplary embodiment taken along the line IV-IV' in FIG. 10. There are high-k layers IPD-B between word lines WL-B and floating gates FG, while there are bit lines BL above the word lines WL-B.

Figure 22:
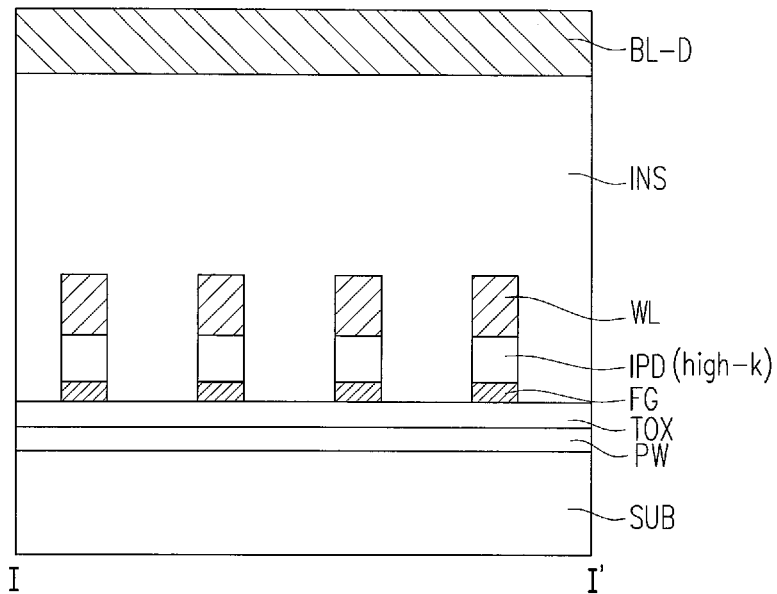
FIG. 22 illustrates a cross-sectional view of the fourth exemplary embodiment taken along the line I-I' in FIG. 3.
Figure 23:
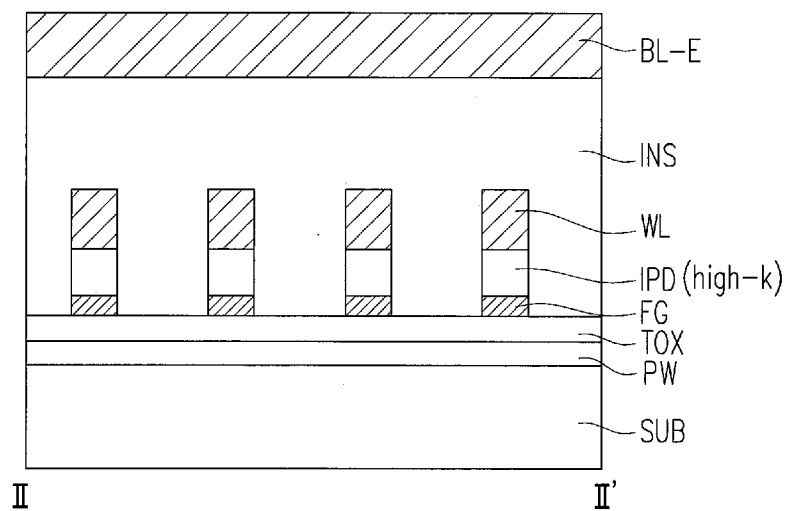
FIG. 23 illustrates a cross-sectional view of the fourth exemplary embodiment taken along the line II-II' in FIG. 3.

FIG. 22 illustrates a cross-sectional view of the fourth exemplary embodiment taken along the line I-I' in FIG. 14. There are high-k layers IPD between word lines WL and floating gates FG, while there are bit lines BL-D above the word lines WL. FIG. 23 illustrates a cross-sectional view of the fourth exemplary embodiment taken along the line II-II' in FIG. 14. There are high-k layers IPD between word lines WL and floating gates FG, while there are bit lines BL-E above the word lines WL.

Fifth Exemplary Embodiment

Figure 24:
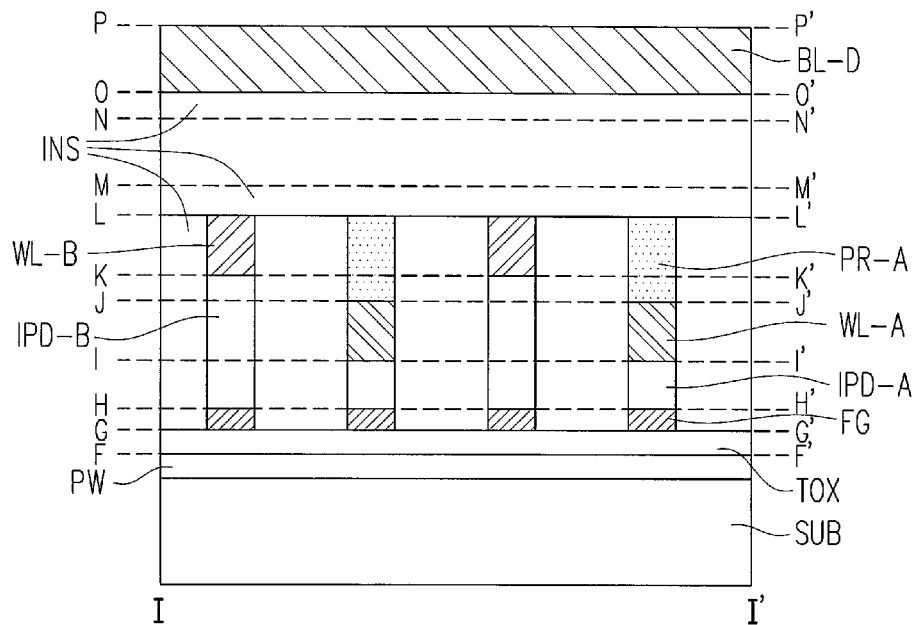
FIG. 24 illustrates a cross-sectional view taken along the line I-I' in FIG. 3.
Figure 25:
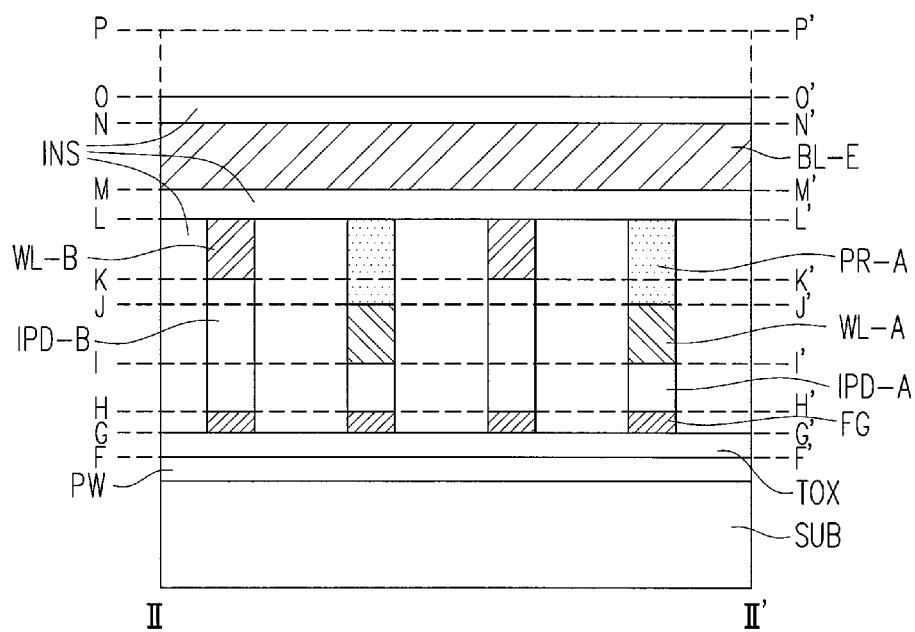
FIG. 25 illustrates a cross-sectional view taken along the line II-II' in FIG. 3.
Figure 26:
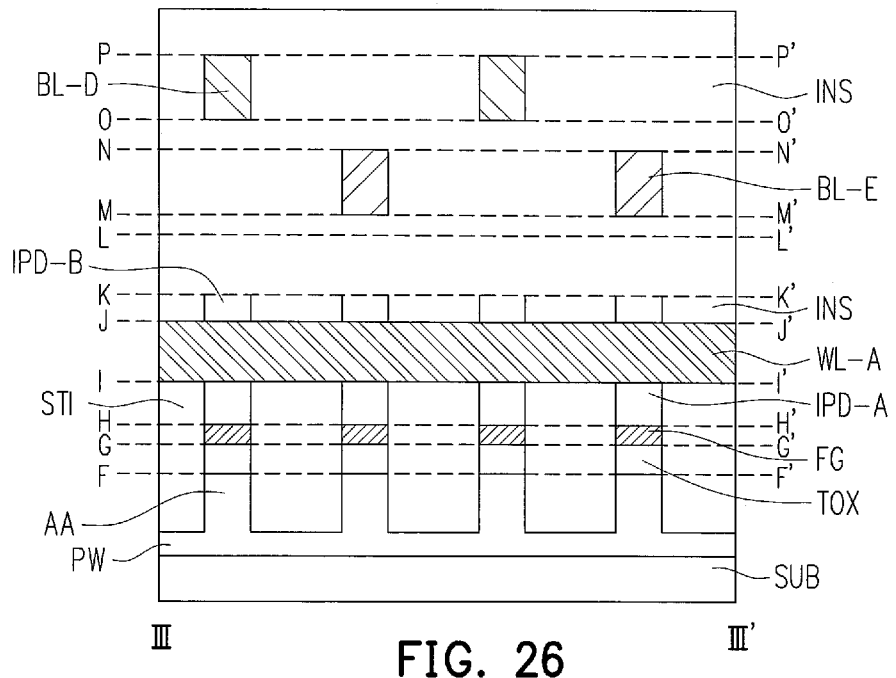
FIG. 26 illustrates a cross-sectional view taken along the line III-III' in FIG. 3.
Figure 27:
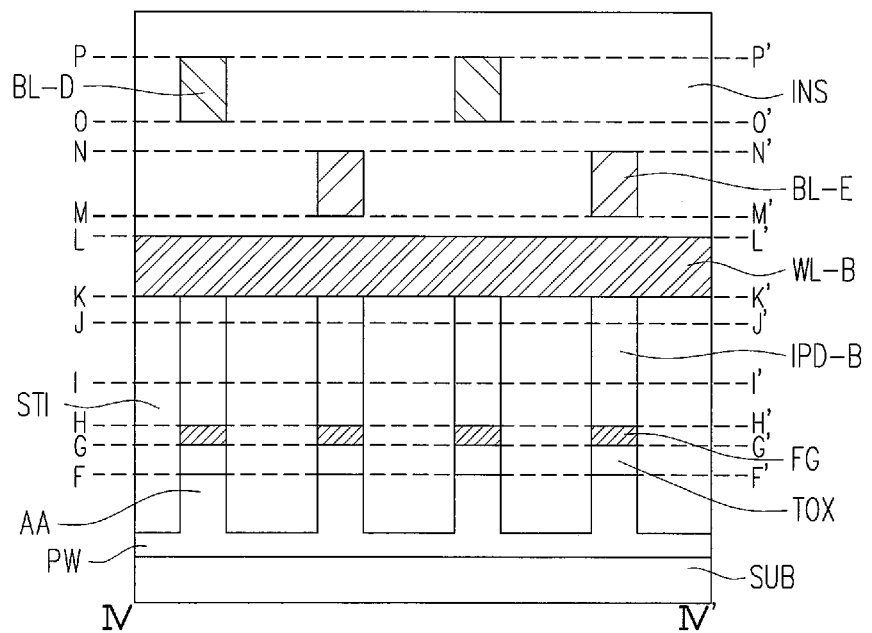
FIG. 27 illustrates a cross-sectional view taken along the line IV-IV' in FIG. 3.

FIG. 24 illustrates a cross-sectional view taken along the line I-I' in FIG. 3. FIG. 25 illustrates a cross-sectional view taken along the line II-II' in FIG. 3. FIG. 26 illustrates a cross-sectional view taken along the line III-III' in FIG. 3. FIG. 27 illustrates a cross-sectional view taken along the line IV-IV' in FIG. 3.

An exemplary embodiment is composed of plenty of layers stacked on the surface of a silicon substrate SUB at the line F-F', as illustrated in FIG. 24, FIG. 25, FIG. 26 and FIG. 27. The tops of tunnel oxide films TOX (i.e. bottoms of floating gates FG) are at the line G-G' above the line F-F'. The tops of floating gates FG are at the line H-H'. The tops of inter-poly dielectric films IPD-A are at the line I-I'. The tops of word lines WL-A are at the line J-J'. The tops of inter-poly dielectric films IPB-B are at the line K-K'. The tops of word lines WL-B are at the line L-L'. The bottoms of bit lines BL-E are at the line M-M'. The tops of bit lines BL-E are at the line N-N'. The bottoms of bit lines BL-D are at the line O-O'. The tops of bit lines BL-D are at the line P-P'.

In the exemplary embodiment of the invention, the line K-K' is above the line J-J', and the line O-O' is above the line N-N'. This relationship between the lines K-K', J-J', O-O' and N-N' is common among the above-mentioned exemplary embodiments.

Six Exemplary Embodiment

A fabrication process of zigzag word lines is described in the following. FIG. 28 to FIG. 38 illustrate cross-sectional views of fabricating zigzag word lines taken along the line II-II' in FIG. 3.

Figure 36:
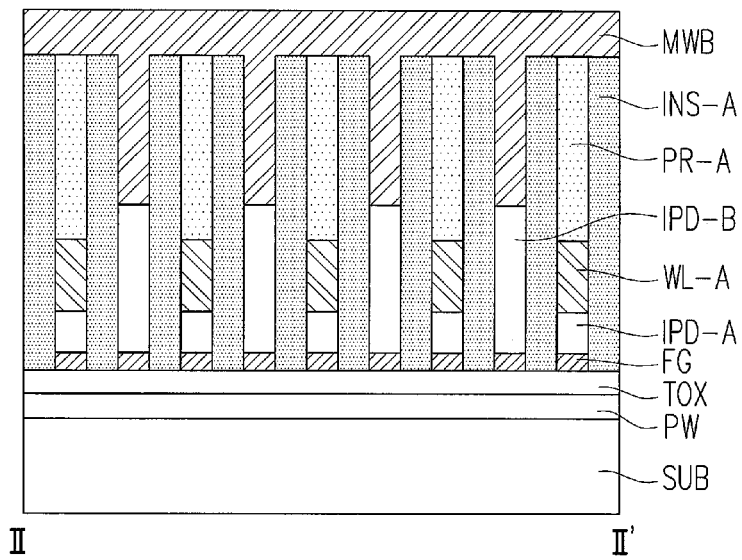
Figure 37:
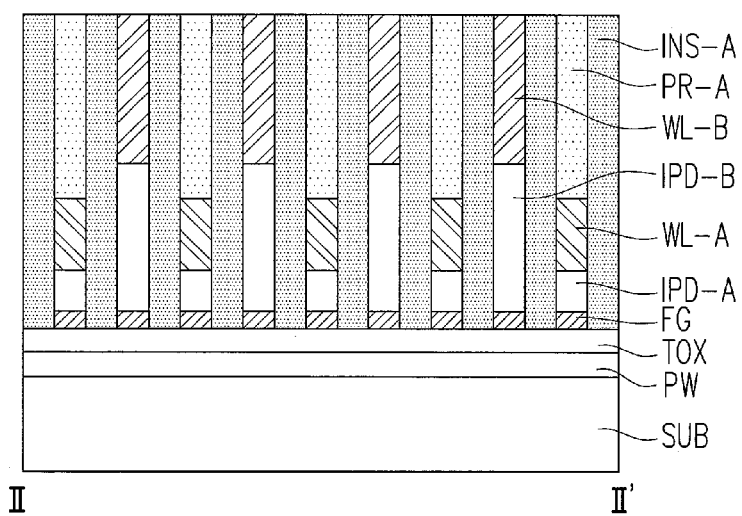

In an exemplary embodiment, the fabrication process of zigzag word lines includes: forming a P-well (PW) in the substrate (SUB) and forming a poly-Si film (PSI), a dielectric film (DFA) and a metal film (MWA) on the substrate (SUB) (FIG. 28); forming mask patterns (PR-A) on the metal film (MWA) (FIG. 28); forming a spacer (SPA) on a sidewall of each mask pattern (PR-A) (FIG. 29); removing a portion of the metal film (MWA) by using the mask patterns (PR-A) and the spacers (SPA) as a mask, so as to form first trenches (TR) through the metal film (MWA) and the dielectric film (DFA) (FIG. 30); filling the first trenches (TR) with a dielectric film (DFB) (FIG. 31); removing the spacers (SPA) (FIG. 32); removing another portion of the metal film (MWA) by using the mask patterns (PR-A) as a mask, so as to form the first word lines, wherein second trenches (TR1) are formed through the metal film (MWA), the dielectric film (DFA) and the poly-Si film (PSI) (FIG. 33); filling the second trenches (TR1) with an insulating film (INS-A) (FIG. 34); etching back a portion of the dielectric film (DFB), so as to form third trenches (TR2) between the insulating films (INS-A) (FIG. 35); forming a second metal film (MWB) in the third trenches (TR2) (FIG. 36); and removing a portion of the second metal film (MWB) outside of the trenches (TR2), so as to form the second word line (WL-B) (FIG. 37).

Figure 28:
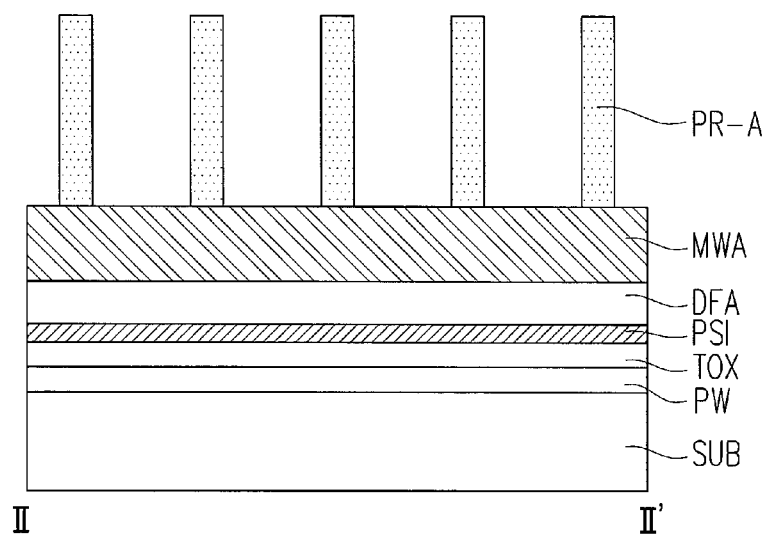
FIG. 28 to FIG. 38 illustrate cross-sectional views of fabricating zigzag word lines taken along the line II-II' in FIG. 3.

Referring to FIG. 28, mask patterns PR-A are formed on a metal film MWA for forming word lines WL-A. A first dielectric film DFA is formed below the metal film MWA and on a poly-Si film PSI for forming floating gates FG. An oxide film TOX for forming tunnel oxide films is formed below the poly-Si film PSI and on a Si substrate SUB.

Figure 29:
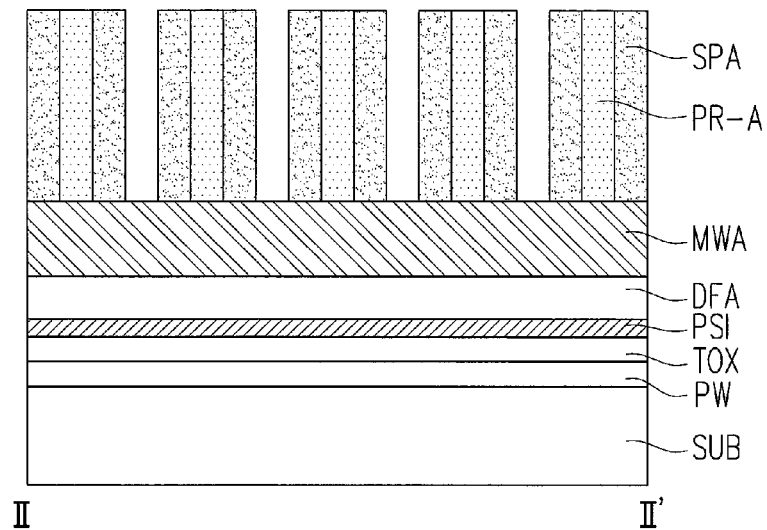
Figure 30:
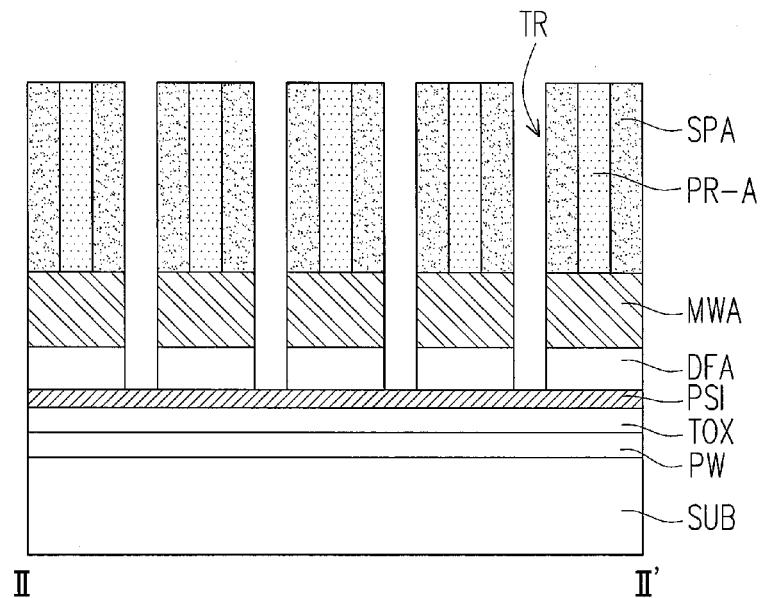
Figure 31:
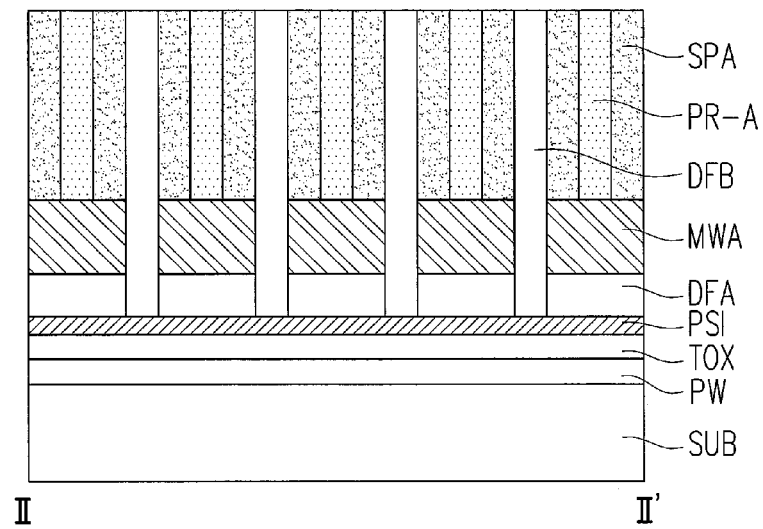
Figure 32:
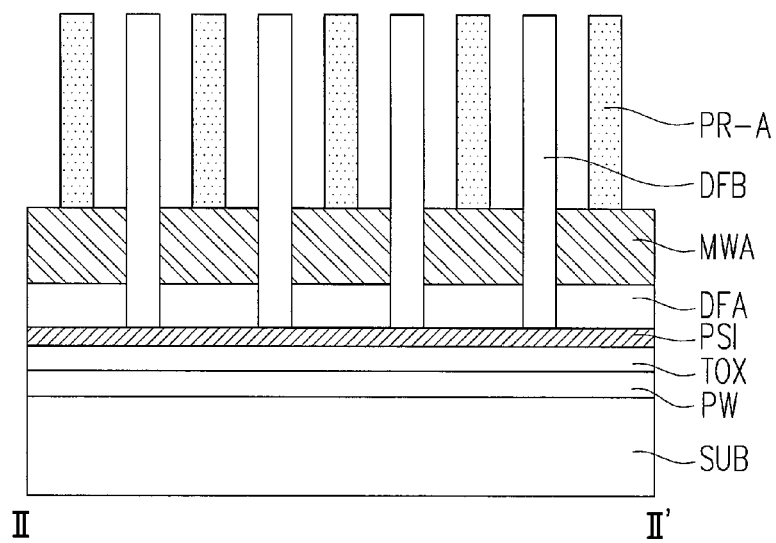

After forming spacers SPA as illustrated in FIG. 29, the metal film MWA and the first dielectric film DFA are partially etched, so as to form trenches TR in the metal film MWA and in the first dielectric film DFA, as illustrated in FIG. 30. Next, a second dielectric film DFB for forming inter-poly films IPD-B is deposited to fill in the trenches TR, as illustrated in FIG. 31. Subsequently, the spacers SPA are removed as illustrated in FIG. 32.

Figure 33:
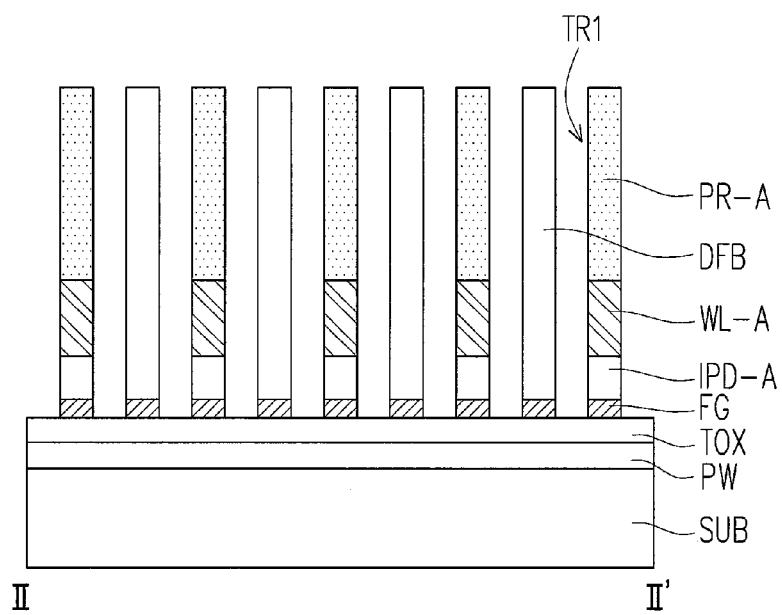
Figure 34:
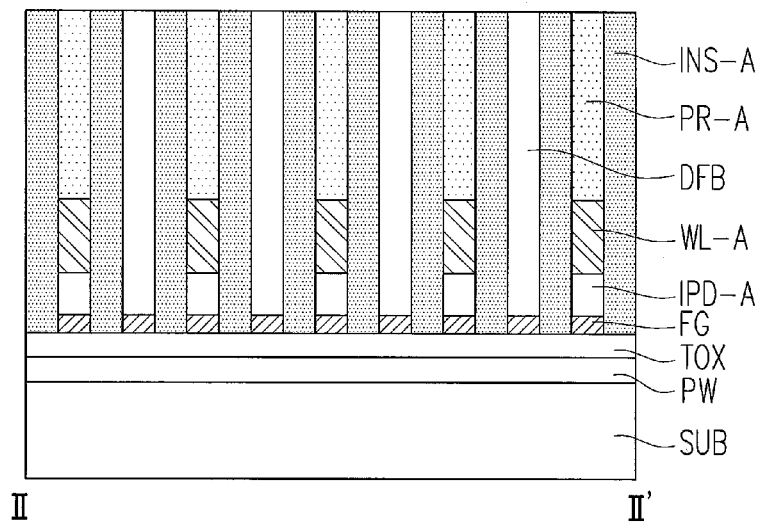

Subsequently, an etching is performed to the metal film MWA, the first dielectric film DFA and the poly-Si film PSI, by using the mask patterns PR-A as a mask, so as to expose a portion of the surface of the oxide film TOX, and thus, word lines WL-A, inter-poly dielectric films IP-A and floating gates FG are formed on the Si substrate SUB and trenches TR1 are formed between the mask patterns PR-A and the second dielectric film DFB, as illustrated in FIG. 33. And then, an interlayer insulating film INS-A is deposited to fill in the trenches TR1, as illustrated in FIG. 34.

Figure 35:
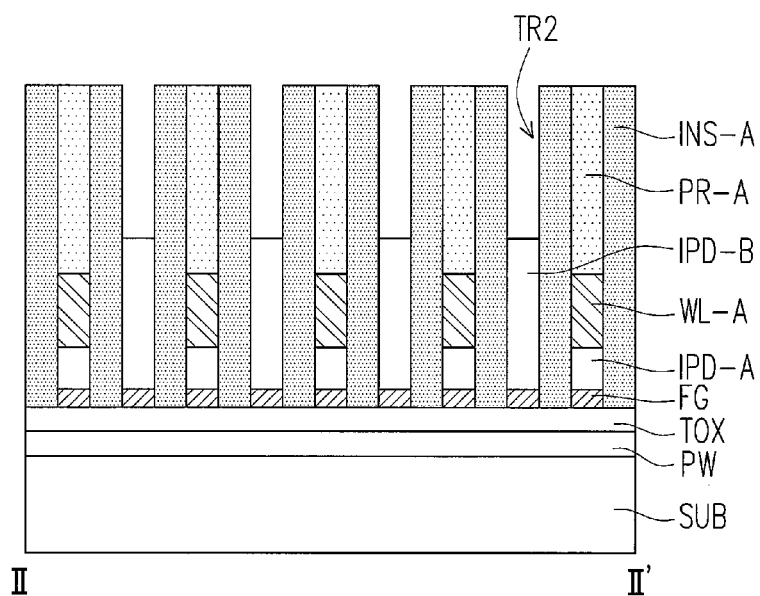

The second dielectric film DFB is partially etched back by a selective etching, so as to form inter-poly films IPD-B and form trenches TR2 between the interlayer insulating films INS-A, as illustrated in FIG. 35. To do this, for example, the inter-poly films IPD-B are beforehand incorporated with N.

In FIG. 36, a metal film MWB for forming word lines WL-B is deposited on the Si substrate SUB filling in the trenches TR2. Subsequently, the metal film MWB outside of the trenches TR2 is removed and thus word lines WL-B are left, as illustrated in FIG. 37.

Figure 38:
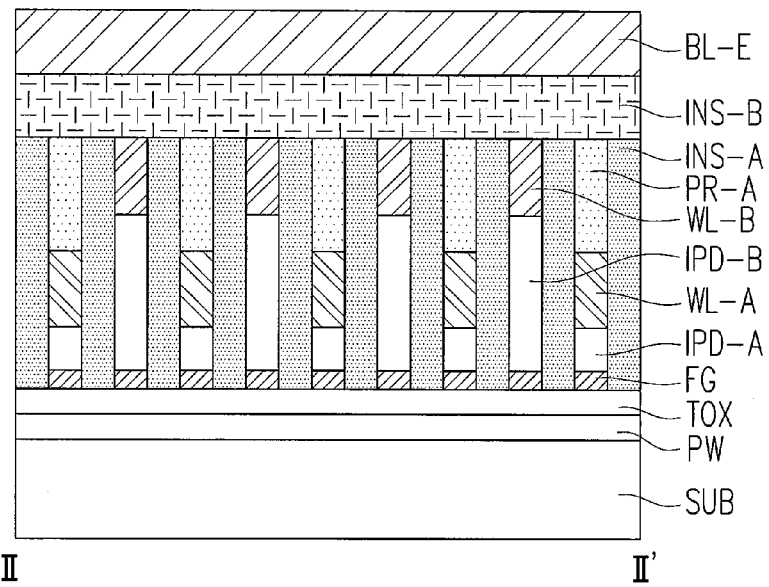

The surfaces of the word lines WL-B, the surfaces of the mask patterns PR-A and the surface of the interlayer insulating film INS-A are covered by an interlayer insulating film INS-B, and then bit lines BL-E are formed on the interlayer insulating film INS-B, as illustrated in FIG. 38.

Seventh Exemplary Embodiment

A fabrication process of zigzag bit lines is described in the following. FIG. 39 to FIG. 46 illustrate cross-sectional views of fabricating zigzag bit lines, taken along the line III-III' in FIG. 3.

Figure 44:
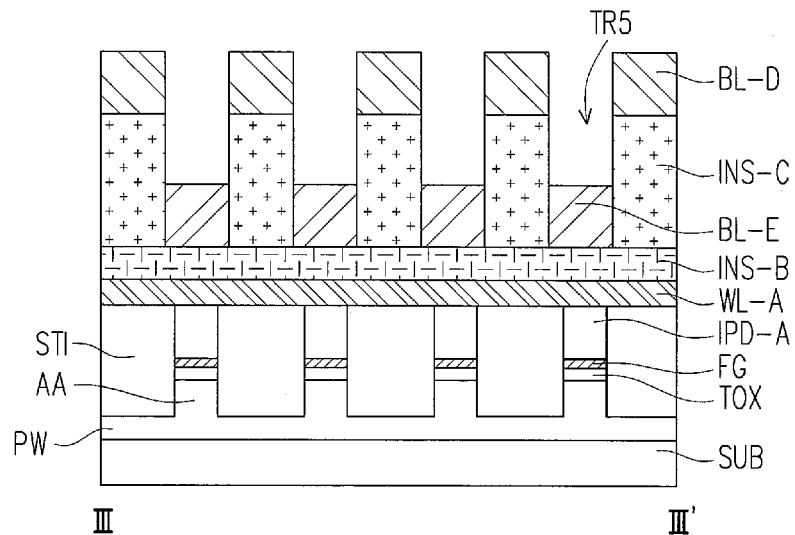
Figure 45:
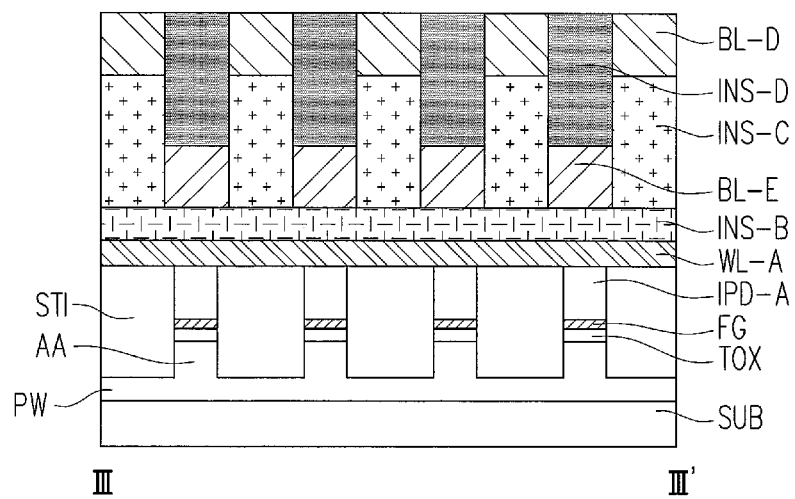

In an exemplary embodiment, the fabrication process of zigzag bit lines includes: forming a metal film (MBE) and an interlayer insulating film (INS-B) on the word line (WL-A) (FIG. 39); forming mask patterns (PR-B) on the metal film (MBE) (FIG. 39); removing a portion of the metal film (MBE) by using the mask patterns (PR-B) as a mask, so as to form the first bit lines (BL-E), wherein first trenches (TR3) are formed between the first bit lines (BL-E) (FIG. 40); filling the first trenches (TR3) with an insulating film (INS-C) (FIG. 41); etching back a portion of the insulating film (INS-C), so as to form second trenches (TR4) between the mask patterns (PR-B) (FIG. 42); forming the second bit lines (BL-D) in the second trenches (TR4) (FIG. 43); removing the mask patterns (PR-B), so as to form third trenches (TR5) between the insulating films (INS-C) (FIG. 44); and filling the third trenches (TR5) with another insulating film (INS-D) (FIG. 45).

Figure 39:
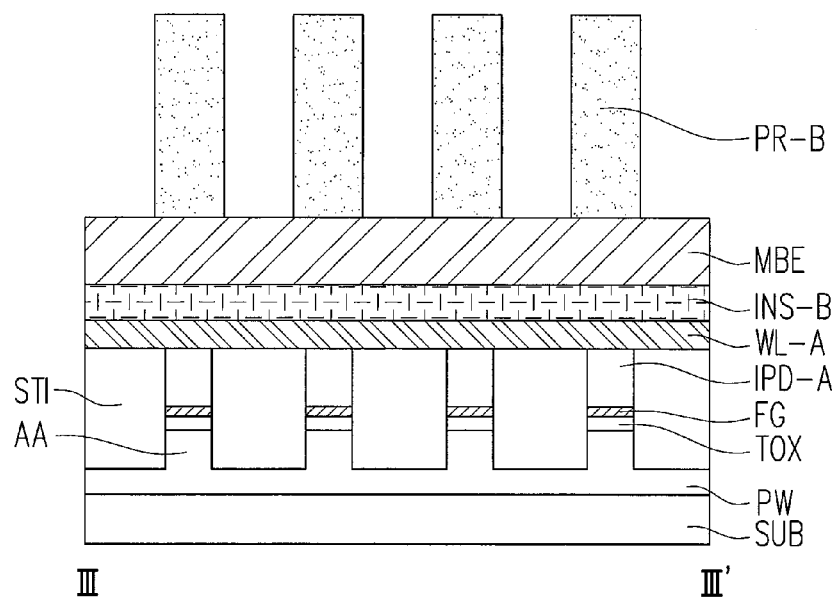
FIG. 39 to FIG. 46 illustrate cross-sectional views of fabricating zigzag bit lines taken along the line III-III' in FIG. 3.

In FIG. 39, mask patterns PR-B are formed on a metal film MBE for forming bit lines BL-E. The metal film MBE is formed on the surface of an interlayer insulating film INS-B. Word lines WL-A and word lines WL-B (not shown but similar to WL-A) are formed below the interlayer insulating film INS-B.

Figure 40:
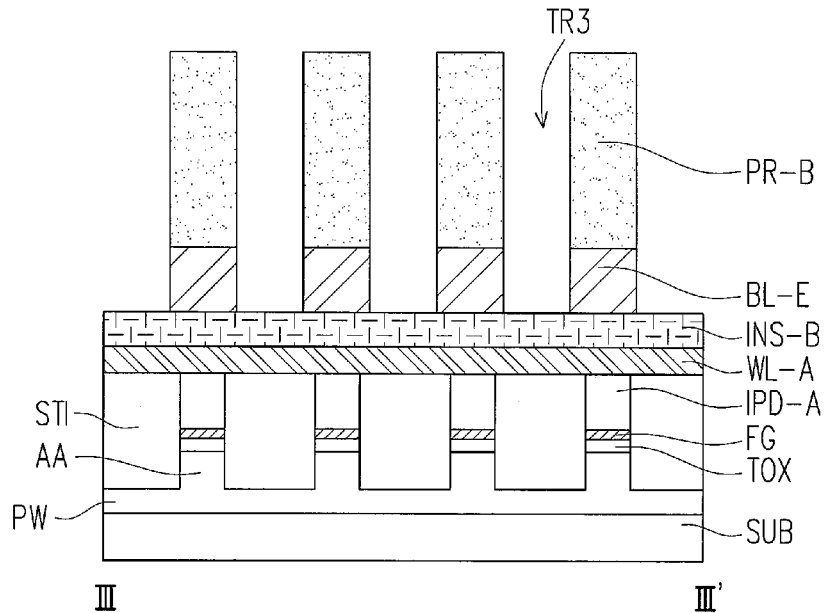
Figure 41:
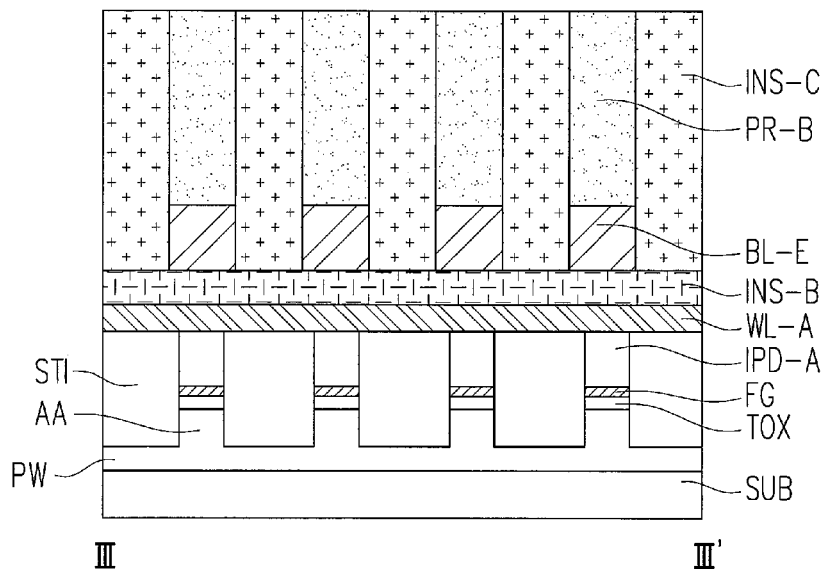

Using the mask patterns PR-B as a mask, the metal film MBE is etched to form the bit lines BL-E and form trenches TR3 between the bit lines BL-E, as illustrated in FIG. 40. An insulating film INS-C is deposited into the trenches TR3, as illustrated in FIG. 41.

Figure 42:
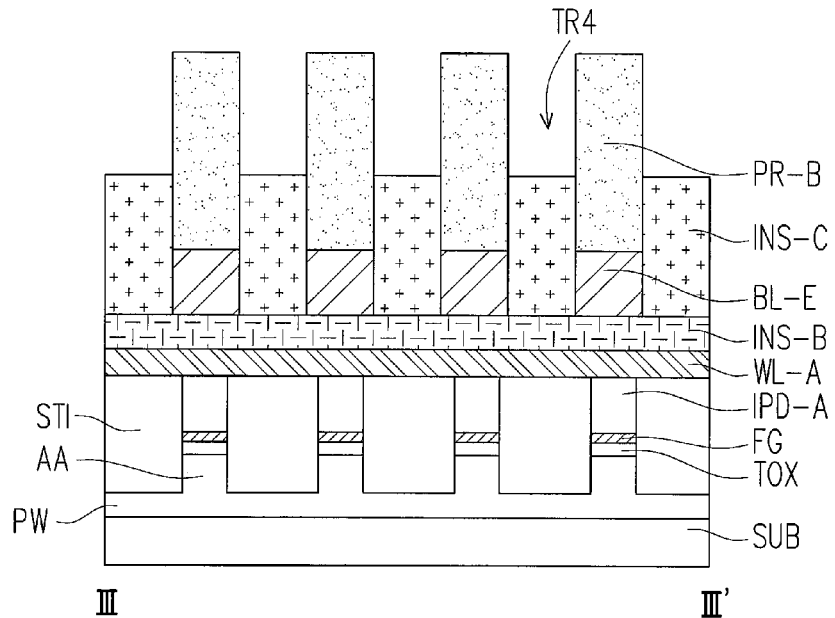

This insulating film INS-C is partially etched back by a selective etching, so that the top portion of each of the mask patterns PR-B is protruded from the surface of the remaining insulating film INS-C and trenches TR4 are formed between the mask patterns PR-B, as illustrated in FIG. 42.

Figure 43:
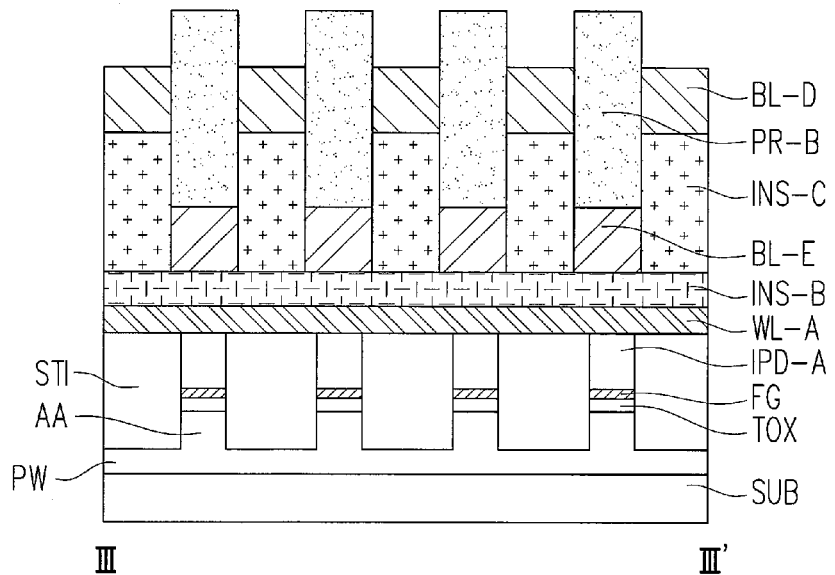

Bit lines BL-D are deposited on the surface of this insulating film INS-C respectively in the trenches TR4, as illustrated in FIG. 43. Subsequently, the mask patterns PR-B are removed to form trenches TR5 between the insulating films INS-C, as illustrated in FIG. 44. The trenches TR5 are buried in the interlayer insulating film INS-C.

Figure 46:
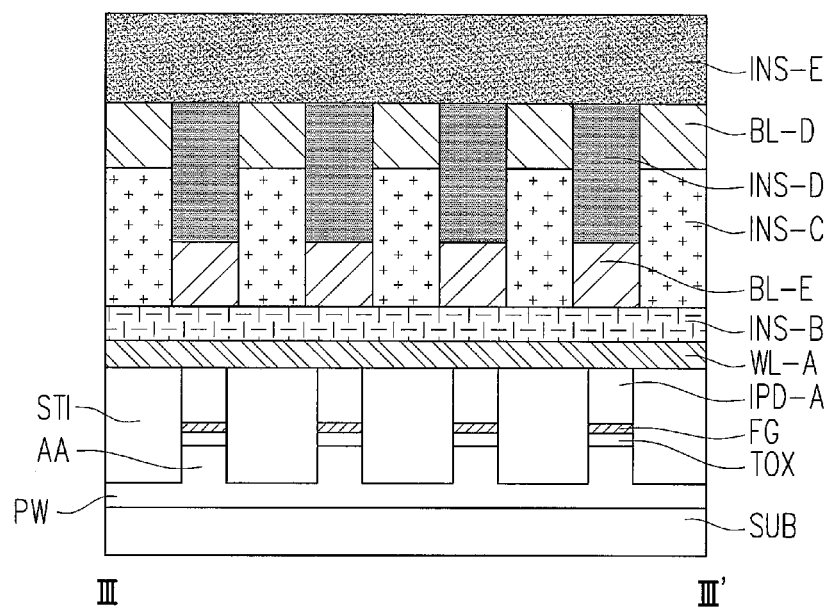

An interlayer insulating film INS-D is then deposited in the trenches TR5, as illustrated in FIG. 45. Finally, the surfaces of bit lines BL-D and the surface of the interlayer insulating film INS-D are covered by an interlayer insulating film INS-E, as illustrated in FIG. 46.

In summary, the distance between neighboring word lines (or bit lines) can be increased by adopting the zigzag body wiring of the exemplary embodiment of the invention, so that the parasitic capacitance between neighboring word lines (or bit lines) can be suppressed. In addition, the zigzag body wiring of the exemplary embodiment of the invention is consistent with the scaling of NAND cells, so that the low bit cost can be achieved to meet the customers' requirement.

The present invention has been disclosed above in the exemplary embodiments, but is not limited to those. It is known to persons skilled in the art that some modifications and innovations may be made without departing from the spirit and the scope of the present invention. Therefore, the scope of the present invention may be defined by the following claims.

What is claimed is:

1. A non-volatile memory device, comprising:
    a well, disposed in a substrate;
    a plurality of first word lines and a plurality of second word lines, disposed on the substrate, arranged periodically and extending in a first direction;
    a plurality of inter-poly dielectric films, disposed on the substrate and respectively beneath the plurality of first word lines and the plurality of second word lines;
    a plurality of floating gates, disposed between the well and the plurality of inter-poly dielectric films; and
    a plurality of tunnel oxide films, disposed between the well and the plurality of floating gates,
    wherein a first distance from the first word lines to the substrate is smaller than a second distance from the second word lines to the substrate.

2. The non-volatile memory device of claim 1, wherein a third distance from a top of the first word lines to the substrate is smaller than or equal to a fourth distance from a bottom of the second word lines to the substrate.

3. The non-volatile memory device of claim 1, wherein the plurality of inter-poly dielectric films comprise:
    a plurality of first inter-poly dielectric films, disposed on the substrate and respectively beneath the first word lines; and
    a plurality of second inter-poly dielectric films, disposed on the substrate and respectively beneath the second word lines,
    wherein a thickness of the plurality of first inter-poly dielectric films is smaller than a thickness of the plurality of second inter-poly dielectric films.

4. The non-volatile memory device of claim 1, wherein the plurality of floating gates comprise:
    a plurality of first floating gates, disposed on the substrate and respectively beneath the plurality of first word lines; and
    a plurality of second floating gates, disposed on the substrate and respectively beneath the plurality of second word lines,
    wherein a thickness of the plurality of first floating gates is smaller than a thickness of the plurality of second floating gates.

5. The non-volatile memory device of claim 1, further comprising:
    a plurality of bit lines, disposed above the first word lines and the second word lines and extending along a second direction different from the first direction.

6. The non-volatile memory device of claim 5, wherein the plurality of bit lines comprise a plurality of first bit lines and a plurality of second bit lines, and a fifth distance from the first bit lines to the substrate is smaller than a sixth distance from the second bit lines to the substrate.

7. A method for operating a non-volatile memory device having a substrate, a well, a plurality of first inter-poly dielectric films, a plurality of second inter-poly dielectric films, a plurality of first word lines and a plurality of second word lines disposed on the substrate and tunnel oxide films, and a first distance from the first word lines to the substrate being smaller than a second distance from the second word lines to the substrate, the method comprising:
    applying a first operating voltage to at least one of the first word lines; and
    applying a second operating voltage to at least one of the second word lines.

8. The method of claim 7, wherein
    the first operating voltage comprises a first program voltage, a first erase voltage, a first pass voltage or a first read voltage; and
    the second operating voltage comprises a second program voltage, a second erase voltage, a second pass voltage or a second read voltage.

9. The method of claim 8, further comprising the following steps for programming the non-volatile memory device:
    applying the first program voltage to at least one of the first word lines; and applying the second program voltage to at least one of the second word lines;
the first program voltage and the second program voltage satisfying the following equation:

$$C_{rA}V_{PGM\text{-}A}=C_{rB}V_{PGM\text{-}B},$$

wherein $V_{PGM\text{-}A}$ is the first program voltage applied to at least one of the first word lines, $V_{PGM\text{-}B}$ is the second program voltage applied to at least one of the second word lines, $C_{rA}$ is a first capacitance coupling ratio determined by a ratio of a capacitance of the first inter-poly dielectric films to a sum of capacitances of the first inter-poly dielectric films and the tunnel oxide films, and $C_{rB}$ is a second capacitance coupling ratio determined by a ratio of a capacitance of the second inter-poly dielectric films to a sum of capacitances of the second inter-poly dielectric films and the tunnel oxide films.

10. The method of claim 8, further comprising the following steps for erasing the non-volatile memory device:
applying a well voltage to the well;
applying the first erase voltage to at least one of the first word lines; and
applying the second erase voltage to at least one of the second word lines;
the first erase voltage, the second erase voltage and the well voltage satisfying the following equation:

$$-C_{rA}(V_{well}-V_{CG\text{-}A})=-C_{rB}(V_{well}-V_{CG\text{-}B}),$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{well}$ is the well voltage, $V_{CG\text{-}A}$ is the first erase voltage applied to at least one of the first word lines, and $V_{CG\text{-}B}$ is the second erase voltage applied to at least one of the second word lines.

11. The method of claim 8, further comprising the following steps for reading the non-volatile memory device having a plurality of cells:
determining whether at least one cell to be read among the plurality of cells is connected with at least one of the first word lines or at least one of the second word lines;
if the at least one cell to be read among the plurality of cells is connected with at least one of the first word lines,
applying the first read voltage to the first word line connected with the at least one cell to be read among the plurality of cells;
applying the first pass voltage to the other first word lines; and
applying the second pass voltage to the second word lines;
if the at least one cell to be read among the plurality of cells is connected with at least one of second word lines,
applying the second read voltage to the second word line connected with the at least one cell to be read among the plurality of cells;
applying the second pass voltage to the other second word lines; and
applying the first pass voltage to the first word lines.

12. The method of claim 11, wherein the first pass voltage and the second pass voltage satisfy the following equation:

$$C_{rA}V_{pass\text{-}A}=C_{rB}V_{pass\text{-}B},$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{pass\text{-}A}$ is the first pass voltage, and $V_{pass\text{-}B}$ is the second pass voltage.

13. The method of claim 11, wherein the first read voltage and the second read voltage satisfy the following equation:

$$C_{rA}V_{read\text{-}A}=C_{rB}V_{read\text{-}B},$$

wherein $C_{rA}$ is a first capacitance coupling ratio determined by a ratio of a capacitance of the first inter-poly dielectric films to a sum of capacitances of the first inter-poly dielectric films and the tunnel oxide films, $C_{rB}$ is a second capacitance coupling ratio determined by a ratio of a capacitance of the second inter-poly dielectric films to a sum of capacitances of the second inter-poly dielectric films and the tunnel oxide films, $V_{read\text{-}A}$ is the first read voltage, and $V_{read\text{-}B}$ is the second read voltage.

* * * * *